(12) United States Patent
Kido

(10) Patent No.: US 6,767,694 B2
(45) Date of Patent: Jul. 27, 2004

(54) PROCESS FOR FORMING PATTERN AND METHOD FOR PRODUCING LIQUID CRYSTAL APPARATUS EMPLOYING PROCESS FOR FORMING PATTERN

(75) Inventor: Shusaku Kido, Izumi (JP)

(73) Assignee: NEC LCD Technologies, Ltd. (JP)

( * ) Notice: Subject to any disclaimer, the term of this patent is extended or adjusted under 35 U.S.C. 154(b) by 165 days.

(21) Appl. No.: 10/084,848

(22) Filed: Feb. 25, 2002

(65) Prior Publication Data

US 2002/0123241 A1 Sep. 5, 2002

(30) Foreign Application Priority Data

Mar. 2, 2001 (JP) ........................................ 2001-058138

(51) Int. Cl.⁷ ................................................ G03F 7/26
(52) U.S. Cl. ...................................... 430/313; 430/317
(58) Field of Search ................................ 430/311, 313, 430/314, 317

(56) References Cited

U.S. PATENT DOCUMENTS 6,037,245 A * 3/2000 Matsuda ..................... 438/586

FOREIGN PATENT DOCUMENTS

JP 2000-164584 6/2000
JP 2000-206571 7/2000

* cited by examiner

Primary Examiner—Kathleen Duda
(74) Attorney, Agent, or Firm—Hayes Soloway P.C.

(57) ABSTRACT

A photosensitive film pattern formed through only one photolithography step and having difference in film thickness is formed utilizing difference in amount of light emitted to the photosensitive film on a film to be etched, and the film to be etched is etched two times to form plural patterns therein by utilizing the difference in film thickness of the photosensitive film pattern, thereby reducing the number of whole manufacturing process steps. In this case, at the time of etching and removing thin photosensitive film out of the photosensitive film pattern, the upper layer of thick photosensitive film out of the photosensitive film pattern has already been modified to a silica film nearly free from being affected by dry-etching, and therefore, the thick photosensitive film can maintain its planar shape nearly equal to that of the thick photosensitive film before etching the thin photosensitive film. Accordingly, the film to be etched is etched to have a pattern nearly equal to designed pattern by using the silica film as a mask.

20 Claims, 22 Drawing Sheets

FIG.1 (PRIOR ART)
FIG.1A
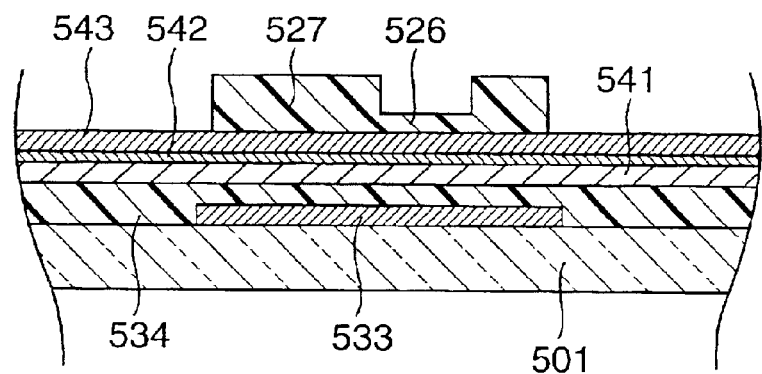
FIG.1B
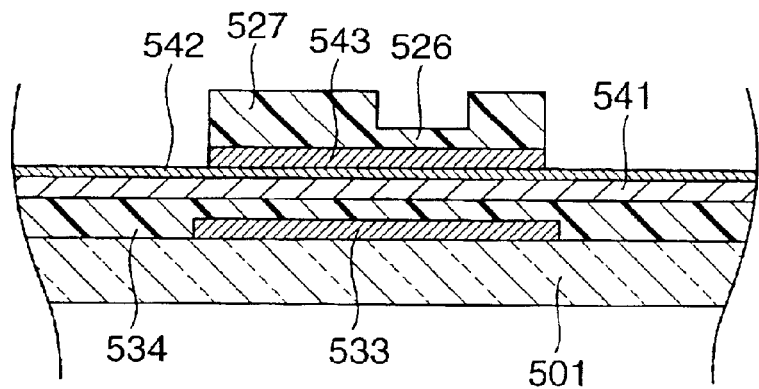

FIG.2 (PRIOR ART)
FIG.2A
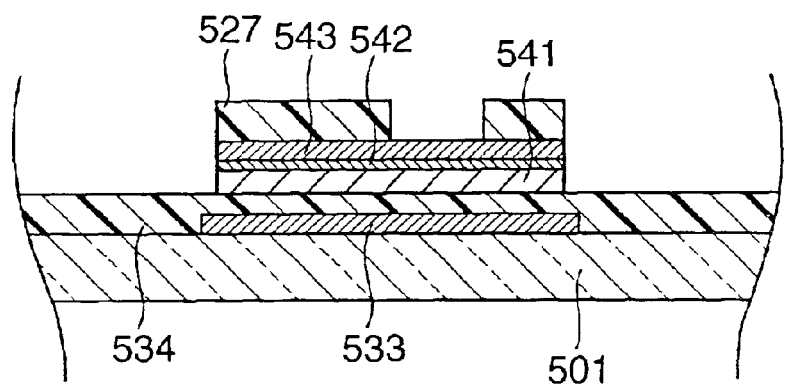
FIG.2B
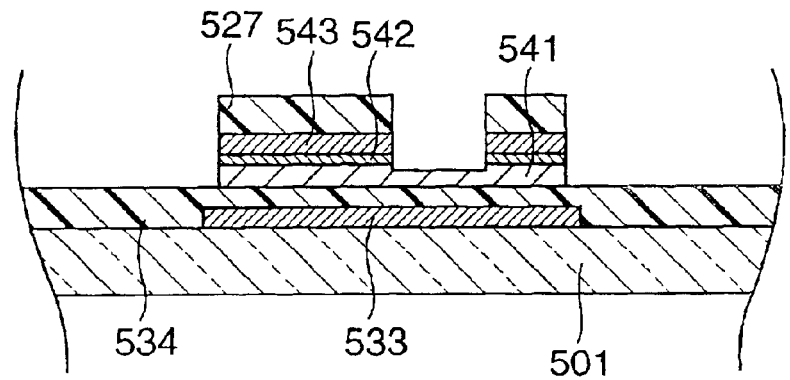

FIG.3 (PRIOR ART)
FIG.3A
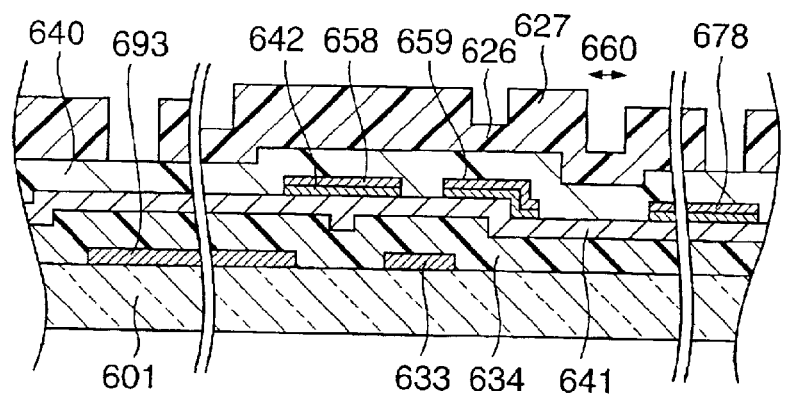
FIG.3B
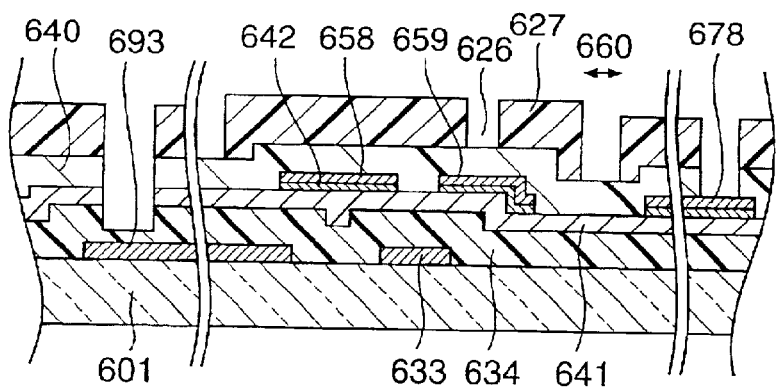
FIG.3C
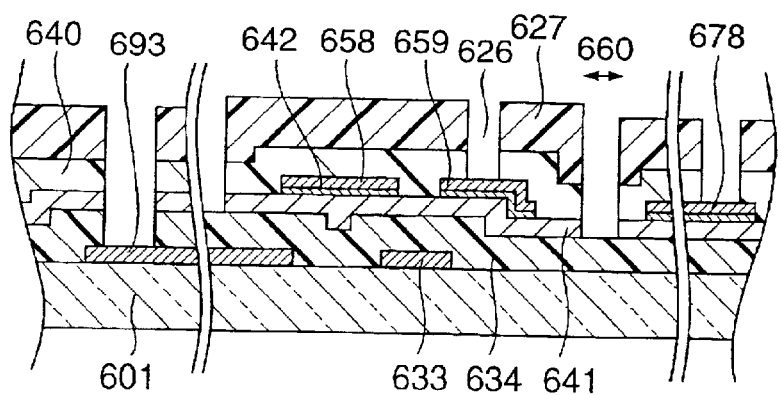

GATE TERMINAL

DRAIN TERMINAL

GATE TERMINAL

DRAIN TERMINAL

GATE TERMINAL

DRAIN TERMINAL

US 6,767,694 B2

PROCESS FOR FORMING PATTERN AND METHOD FOR PRODUCING LIQUID CRYSTAL APPARATUS EMPLOYING PROCESS FOR FORMING PATTERN

BACKGROUND OF THE INVENTION

1. Field of the Invention

The present invention relates to a process for forming a pattern of a semiconductor device used in a liquid crystal display apparatus and a method for producing a liquid crystal display apparatus using the process for forming a pattern, and in particular, to a process for forming a complicated pattern such as wiring in a simplified manner, and a method for producing a liquid crystal display apparatus using the process.

2. Description of the Prior Art

A method for producing a liquid crystal display apparatus uses a photolithography technique and a dry etching technique to produce an integrated circuit. To reduce process steps for producing the integrated circuit in the process for producing a liquid crystal display apparatus, methods for reducing the number of the total process steps for forming patterns such as wirings are exercised as well as methods to reduce the production cost thereof.

Among a variety of proposals to greatly reduce the production cost, one method proposes that two or more PR process steps required in the conventional technique can be reduced to only one process step.

That is, the first conventional example (JP-A-2000-206571) applies the above-stated method to a manufacturing process of an inversely staggered thin film transistor (hereinafter referred to as a "TFT"), and FIGS. 1A to 2B are schematic cross sectional views of associated regions in a vicinity of a TFT showing main process steps of the manufacturing process.

As shown in FIG. 1A, a gate electrode 533 and a gate insulating film 534 are formed on a first transparent electrode 501, and then an amorphous silicon (a-Si) film 541, an $n^+$type amorphous silicon ($n^{30}$ type a-Si) film 542 and a metal film 543 for source/drain electrodes are deposited in order thereon. A photosensitive film is further coated on the metal film 543 to a thickness of from 1 to 2 µm and then exposed and developed to form a thick photosensitive film pattern 527 having a thick film thickness and a thin photosensitive film pattern 526 having a thin film thickness.

As shown in FIG. 1B, the metal film 543 is etched and removed by using the thick photosensitive film pattern 527 and the thin photosensitive film pattern 526 as a mask to expose the $n^+$ type a-Si film 542.

As shown in FIG. 2A, the $n^{30}$ type a-Si film 542 and the a-Si film 541 thereunder are subjected to dry etching step together with the thin photosensitive film pattern 526 and the metal film 543 is exposed between the thick photosensitive film patterns 527 left after the dry etching.

As shown in FIG. 2B, the metal film 543 and the n+ type a-Si film 542 are etched and removed by using the remaining thick photosensitive film pattern 527 as a mask. At this time, a part of the a-Si film 541 is simultaneously etched.

As described above, two different patterns of the film to be etched can be formed by utilizing the photosensitive film patterns 527 and 526 having different film thicknesses.

Also the following second conventional example (JP-A-2000-164584) applies the above-stated method to a manufacturing process of an inversely staggered TFT, and FIGS. 3A to 3C are schematic cross sectional views of a region of a TFT, a gate terminal electrode and a drain terminal electrode showing the main process steps in the order of manufacturing process.

As shown in FIG. 3A, a gate electrode 633, a gate terminal electrode 693 and a gate insulating film 634 are formed on a first transparent substrate 601, and an a-Si film 641, an n type a-Si film 642 and a metal film for source/drain electrodes are sequentially deposited thereon. The metal film and the n+ type a-Si film 642 thereunder are then patterned to have the same pattern to form a source electrode 659 and an ohmic layer thereunder, a drain electrode 658 and an ohmic layer thereunder, and a drain terminal electrode 678 and an ohmic layer thereunder. After depositing a passivation film 640 thereon, a resist pattern is formed such that openings are formed therein above the gate terminal electrode 693 and the drain terminal electrode 678, a thin photosensitive film pattern 626 having a thin film thickness is formed above the source electrode 659 and a separation region 660 to separate an a-Si film next thereto, and a thick photosensitive film pattern 627 having a thick film thickness is formed above the other regions.

Subsequently, as shown in FIG. 3B, the thin photosensitive film pattern 626 is etched and removed by utilizing the resist pattern while optimizing the etching conditions so as to at least remove the photosensitive film pattern 626, whereby the passivation film 640 on the drain terminal electrode 678 is completely removed and the films ranging from the passivation film 640 to a part of the gate insulating film 634 in a vertical direction on the gate terminal electrode 693 are removed.

Furthermore, as shown in FIG. 3C, both the passivation film 640 and the a-Si film 641 corresponding to the a-Si film separation region 660 are removed and simultaneously a part of the gate insulating film 634 remaining on the gate terminal electrode 693 is removed by optimizing the etching conditions.

According to the manufacturing process of the second conventional example, the contact holes on the respective electrodes are formed and the a-Si film is separated through only one PR process step by utilizing the resist film having different film thicknesses.

Techniques employed in both the first and second conventional examples described above are developed to reduce the number of manufacturing process steps in the following manner. That is, after coating a photosensitive film of a single layer on a film to be etched, a photosensitive film pattern having different film thicknesses is formed by utilizing an exposure having different amounts of light, and the film to be etched is etched by utilizing the difference in film thickness thereof.

However, in the first and second conventional examples, when the thin photosensitive film pattern out of the photosensitive film pattern is etched and removed, the thick photosensitive film pattern is also etched to have an appearance largely different from that of the thick photosensitive film pattern before being etched since the appearance of the thick photosensitive film pattern is continuously changed in accordance with passage of time during the etching. Therefore, it is expected that by using the thick photosensitive film pattern as a mask, the film to be etched is etched to have a pattern greatly different from that designed by a process designer.

SUMMARY OF THE INVENTION

An object of the invention is to provide a process for forming a pattern and a manufacturing process for producing a liquid crystal display apparatus using the same, in which in the event a film to be etched is etched by utilizing a photosensitive film pattern (hereinafter referred to as a resist pattern) having difference film thicknesses, while a thick resist portion of the resist pattern having a film thickness thicker than that of a thin resist portion thereof is being exposed to the atmosphere used for etching and removing the thin resist portion, the shape of the thick resist pattern can be maintained.

The first aspect of the process for forming a pattern in accordance with the invention comprises:

a resist pattern formation step of coating a first resist film and a second resist film in order on a film to be etched on a substrate, and further, forming a resist pattern by patterning the first resist film and the second resist film to make the first resist film broader than the second resist film while making the second resist film positioned on the first resist film;

a first patterning step of etching the film to be etched to form a first pattern in the film to be etched by using the resist pattern as a mask; and a resist etching step of etching the resist pattern to remove at least a portion of the first resist film, the portion being not covered by the second resist film, to thereby form a remaining resist pattern consisting of the first resist film and the second resist film, in which the resist etching step further is constructed such that the second resist film is in a state of a resist film having higher resistance against dry-etching than that of said first resist film at least during said resist etching step.

According to the first aspect of the process for forming a pattern in accordance with the invention, the remaining resist pattern is formed to have a pattern different from the resist pattern used in the first patterning step and in addition, nearly equal to the pattern of the second resist film before the resist etching step, and therefore, when subjecting the film to be etched to a second patterning step, the pattern of the second resist film can be transferred with high accuracy to the film to be etched by using the remaining resist pattern as a mask.

The second aspect of the process for forming a pattern in accordance with the invention is constructed by further adding the following construction to the first aspect of the process for forming a pattern:

in the resist pattern formation step, the resist pattern includes a first opening formed in the first resist film and a second opening formed in the second resist film, and the first opening is formed inside the second opening, and in the resist etching step, the remaining resist pattern is formed to have an overhang of the second resist film with respect to the first resist film.

According to the second aspect of the process for forming a pattern in accordance with the invention, the remaining resist pattern is formed different from the resist pattern used in the first patterning step and in addition, nearly equal to the pattern of the second resist film before the resist etching step. Therefore, when an electrically conductive film is deposited on the remaining resist pattern and the remaining resist pattern is removed together with the electrically conductive film thereon to thereby form an electrically conductive pattern connected to the film to be etched. In this case, the electrically conductive pattern is formed as a result of the second patterning step in the one photoresist step such that the pattern of the second resist film is transferred with high accuracy to the electrically conductive pattern.

The third aspect of the process for forming a pattern in accordance with the invention is constructed by further adding the following construction to the first aspect of the process for forming a pattern:

a gate wiring and a gate insulating film covering the gate wiring are formed on the substrate and under the film to be etched;

the film to be etched is a laminated film formed by depositing a semiconductor film, a semiconductor film doped with impurities and a metal film for source/drain electrodes in order on the gate insulating film; and the resist pattern is formed on the laminated film.

According to the third aspect of the process for forming a pattern in accordance with the invention, the remaining resist pattern is formed to have a pattern different from the resist pattern used in the first patterning step and in addition, nearly equal to the pattern of the second resist film before the resist etching step, and therefore, when subjecting the film to be etched to a second patterning step, the pattern of the second resist film can be transferred with high accuracy to the film to be etched by using the remaining resist pattern as a mask.

The fourth aspect of the process for forming a pattern in accordance with the invention is constructed by further adding the following steps to the third aspect of the process for forming a pattern:

a step of depositing a protective insulating film on the gate insulating film after removing the remaining resist pattern used in a second patterning step, the second patterning step being performed such that the laminated film is etched using the remaining resist pattern as a mask;

a step of coating a third resist film and a fourth resist film in order on the protective insulating film and patterning the third resist film and the fourth resist film to make the third resist film broader than the fourth resist film while making the fourth resist film positioned on the third resist film to form a second resist pattern consisting of the third resist film and the fourth resist film, the second resist pattern having an opening therein;

a step of at least removing associated portion of the protective insulating film using the second resist pattern as a mask to expose a surface of an electrically conductive layer consisting of the laminated film and positioned below the protective insulating film; and a step of selectively etching the third resist film out of the second resist pattern to make an overhang of the fourth resist film with respect to the third resist film in the opening, in which the overhang is formed such that the fourth resist film is made to include silicon atoms to change the fourth resist film into a silicon-doped fourth resist film and then, the silicon-doped fourth resist film is modified to a silicon oxide film through a plasma treatment performed using a mixed gas containing at least oxygen, and thereafter, an associated part of the third resist film is removed in a lateral direction.

According to the fourth aspect of the process for forming a pattern in accordance with the invention, the opening is formed as a result of the first patterning step in the protective insulating film exposing the surface of the laminated film by using the second resist pattern and further, the overhang of the fourth resist film with respect to the third resist film is formed around the opening. Therefore, when a second electrically conductive film is deposited covering the opening, the third and fourth resist films, and then, the third and fourth resist films are removed together with the second electrically conductive film thereon to thereby form a second electrically conductive pattern connected to the laminated film. In this case, the second electrically conductive pattern is formed as a result of the second patterning step such that the pattern of the fourth resist film is transferred with high accuracy to the second electrically conductive pattern.

BRIEF DESCRIPTION OF THE DRAWINGS

FIGS. 1A and 1B are cross sectional views showing process steps of a conventional manufacturing process;

FIGS. 2A and 2B are cross sectional views showing process steps subsequent to FIG. 1B;

FIGS. 3A to 3C are schematic cross sectional views showing process steps of another conventional manufacturing step;

DETAILED DESCRIPTION OF THE PREFERRED EMBODIMENTS

A process for forming a pattern according to a first embodiment of the invention will be described with reference to the cross sectional views related to the manufacturing process steps shown in FIGS. 4A to 4C and FIGS. 5A to 5C.

Figure 4A:
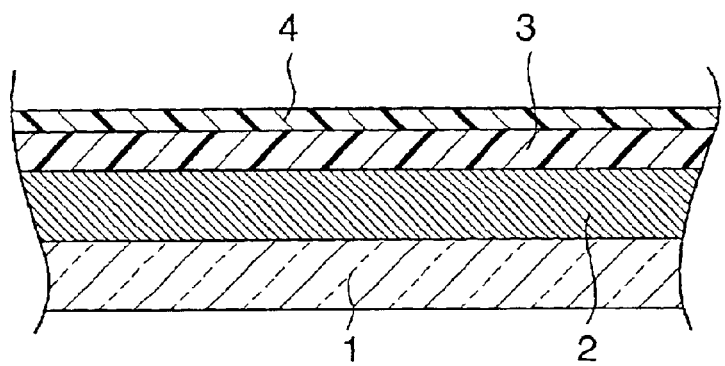
FIGS. 4A to 4C are cross sectional views showing process steps of a first embodiment of the invention in order.

As shown in FIG. 4A, a film to be etched 2 is deposited on a insulating substrate 1, and a first resist film 3 made of positive resist having a film thickness of about 500 nm is coated thereon by the known photolithography technique. A second resist film 4 is further coated on the first resist film 3.

Figure 4B:
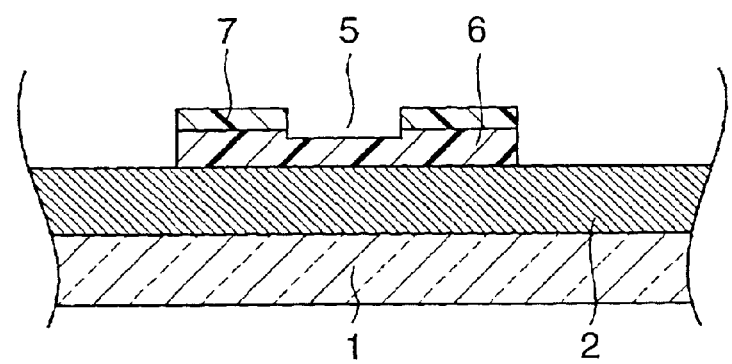

The resist films are exposed by using a reticle having, for example, a light-shielding portion and a translucent portion as a mask, and then developed to form a resist mask 6 consisting of the first resist film and having a resist concave portion 5 corresponding to the translucent portion, and resist masks 7 consisting of the second resist film and sandwiching the resist concave portion 5 therebetween, as shown in FIG. 4B.

Figure 4C:
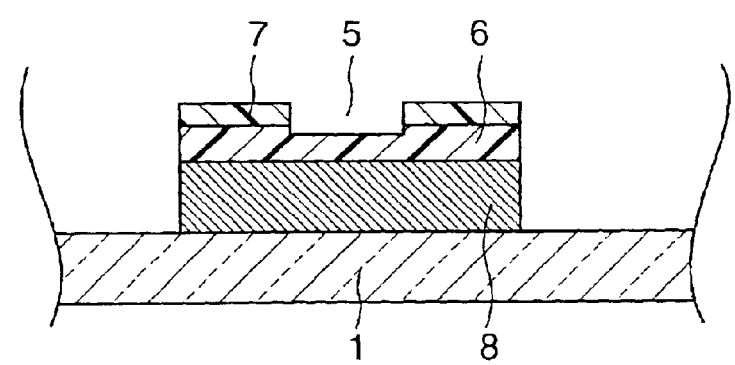

As shown in FIG. 4C, the film to be etched 2 is etched by using the resist mask 6 and the resist masks 7 as a mask to form an island 8 consisting of the film to be etched 2.

Figure 5A:
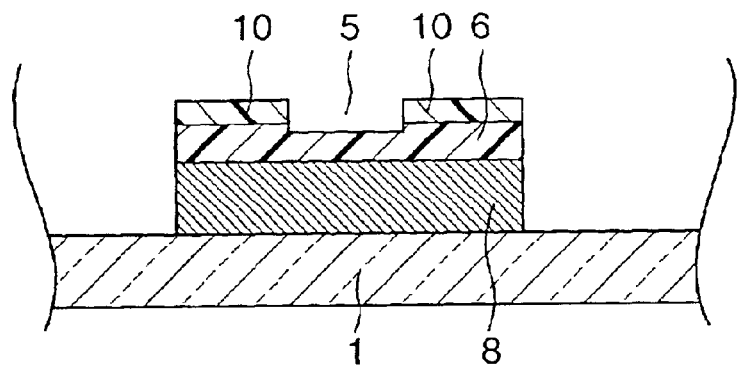
FIGS. 5A to 5C are cross sectional views showing process steps subsequent to FIG. 4C.

As shown in FIG. 5A, the resist masks 6 and 7 are immersed in a silylating agent, such as silazane, to silylate only the resist mask 7 to transform the resist mask 7 into a silylated film. The silylated film contains a large amount of silicon atoms. In this case, the surface of the resist mask 6 is not silylated since the resist mask 6 consists of the first resist mask 3 made of a resist film free from being silylated.

The first resist film and the second resist film having the above-described characteristics are concretely comprised of the following materials.

As the first resist film, for example, an organic material such as rubber system that does not contain a phenolic hydroxyl group capable of reacting with a silylating agent is selected.

As the second resist film, a novolak resin or a polyvinyl phenol is employed to make a phenolic hydroxide group contained therein, which reacts with the silylating agent to form siloxane, polysiloxane, polysilane, polysilyne or carbosilane in the surface of the second resist film.

After the above-stated silylating reaction, a plasma 10 treatment is carried out under the following conditions in the state shown in FIG. 5A to oxidize the second resist film: gas pressure: 40 Pa; $O_2/SF_6$/He gas flow rate: 200/10/100 sccm; RF power: 1,500 W; etching time: 20 seconds.

The above-described plasma treatment makes the silylated film oxidized changing it into a silica film 10. The silica film 10 is formed such that silicon contained in the silylated film reacts with oxygen to change the silylated film into an oxide film. Note that although $O_2/SF_6/He$ gas is used in the plasma treatment, other mixed gas containing oxygen may also be used. For example, in the case where a mixture of an $O_2$ gas and an inert gas is employed, an $O_2/Ar$ gas or an $O_2/Ar$ gas can be used, and in the case where a mixture of an $O_2$ gas and a fluorine series gas is employed, an $O_2/SF_6$ gas, an $O_2/CF_4$ gas or an $O_2/CHF_3$ gas can be used.

Thereafter, ashing using the following conditions is carried out to remove the resist film under the resist concave portion 5 to expose the island 8: gas pressure: 10 Pa; $O_2$ gas flowrate: 400 sccm; RF power: 1,500 W; etching time: 30 seconds. After the ashing, the resist mask 6 shown in FIG. 5A changes into a resist mask 11 shown in FIG. 5B. Note that in the case where the silylated film is used as is seen in this embodiment, instead of the two steps of performing the plasma treatment and the ashing, only one ashing step can be applied using the following ashing conditions to oxidize the silylated film while removing the resist film under the resist concave portion: gas pressure: 20 Pa; $O_2$ gas flow rate: 400 sccm; RF power: 1,500 W; etching time: 40 seconds.

Figure 5B:
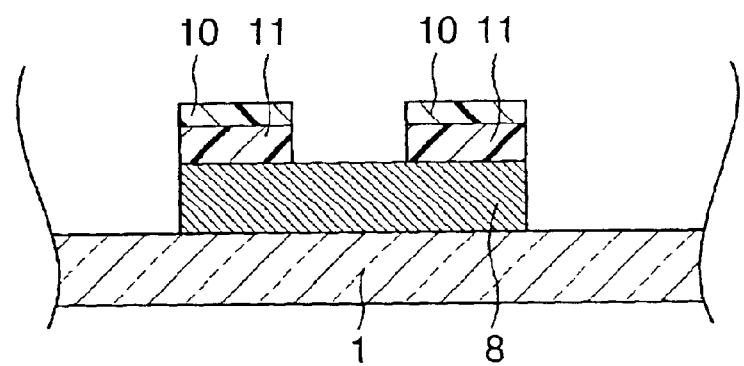
Figure 5C:
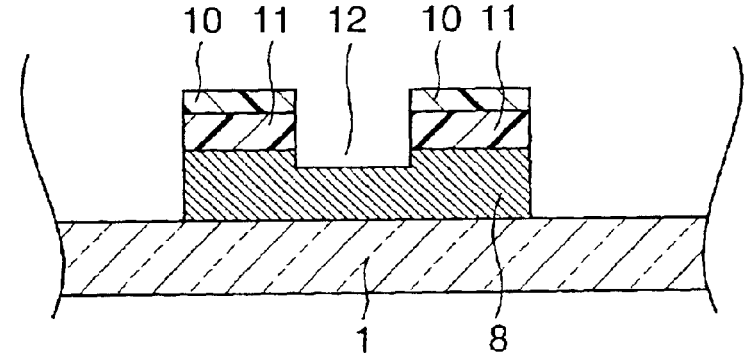

The island 8 is subjected to dry-etching by using the silica film 10 and the resist film 11 as an etching mask to etch an exposed part of the island 8, thereby forming a concave portion 12 in the island 8 as shown in FIG. 5C.

Finally, the silica film 10 and the resist mask 11 are removed to form the island 8 having the concave portion 12 therein.

As is seen in this embodiment, the first patterning step is carried out in the process steps of FIG. 4B to FIG. 4C, and the resist etching step (ashing) is carried out in the process steps of FIG. 5A to FIG. 5B. As the silica film 10 is scarcely affected by the ashing that uses a gas including mainly $O_2$ gas, the silica film 10 can maintain its planar shape nearly equal to that of the silica film 10 before the ashing, meaning that the silica film 10 can maintain its planar shape nearly equal to that of the resist mask 7. Therefore, the resist mask 11 can be formed with high accuracy so as to make the planar shape of the concave portion 12 nearly equal to the designed planar shape.

A process for forming a pattern according to the second embodiment of the invention will be described with reference to FIGS. 6A to 6C and FIGS. 7A and 7B showing the cross sectional views of the manufacturing process steps employed therein.

Figure 6A:
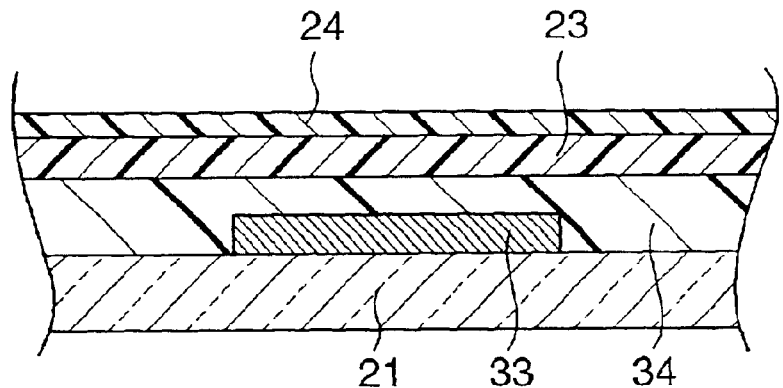
FIGS. 6A to 6C are cross sectional views showing process steps of a second embodiment of the invention in order.

As shown in FIG. 6A, a lower-layered wiring 33 is formed on an insulating substrate 21, and a insulating film 34 is deposited to cover the lower-layered wiring 33.

A first resist film 23 made of positive resist and having a film thickness of about 500 nm is coated on the insulating film 34 by using the known photolithography technique. Subsequently, a second resist film 24 is coated on the first resist film 23. In this case, the second resist film 24 is a positive resist film that can be silylated and has a film thickness of about 300 nm.

Figure 6B:
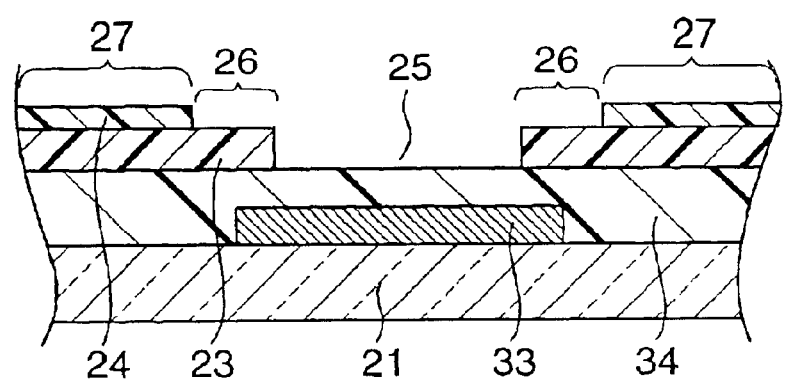

The resist films 23, 24 are exposed and developed by using a reticle having, for example, a light-shielding portion and a translucent portion as a mask to form an opening 25 corresponding to the transparent portion, a thin resist portion 26 corresponding to the translucent portion, and a thick resist portion 27 corresponding to the light-shielding portion, as shown in FIG. 6B.

Figure 6C:
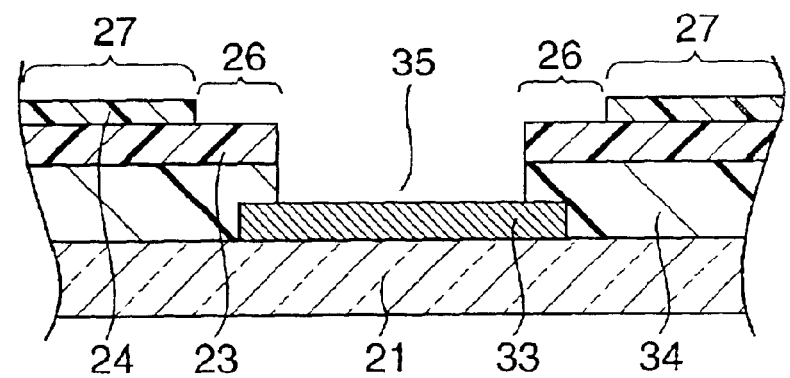

As shown in FIG. 6C, the insulating film 34 is subjected to the first patterning step of etching and removing associated portion of the insulating film 34 using the thin resist portion 26 and the thick resist portion 27 as a mask to form a contact hole 35 in the insulating film 34 located above the lower-layered wiring 33.

Figure 7A:
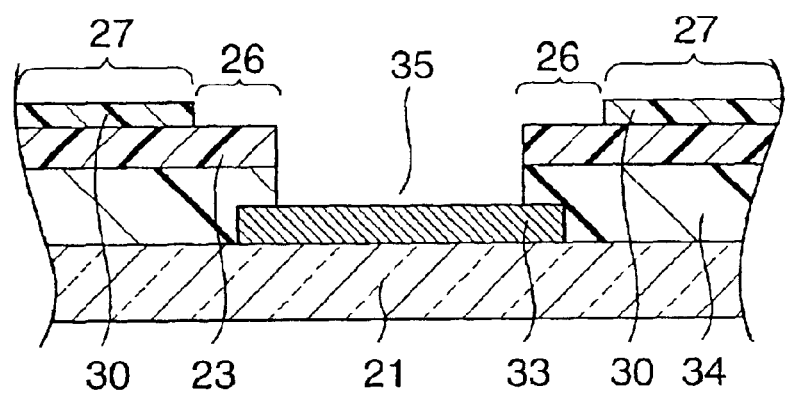
FIGS. 7A and 7B are cross sectional views showing process steps subsequent to FIG. 6C.

As shown in FIG. 7A, the thin resist portion 26 and the thick resist portion 27 are immersed in a silylating agent, such as silazane, to make only the second resist film 24 out of the thick resist portion 27 silylated to form a silylated film. The silylated film contains a large amount of silicon atoms. In this case, the surface of the thin resist portion 26 is not silylated since the thin resist portion 26 is made of the first resist mask 23 free from being silylated.

Plasma treatment is then carried out under the following conditions: gas pressure: 40 Pa; $O_2/SF_6/He$ gas flow rate: 200/10/100 sccm; RF power: 1,500 W; etching time: 20 seconds. As shown in FIG. 7A, the silylated film is oxidized to change into a silica film 30 through the plasma treatment. The silica film 30 is formed such that the silicon contained in the silylated film reacts with oxygen and then the silylated film is changed into an oxide film (i.e., the silica film 30). Thereafter, the thin resist portion 26 and the thick resist portion 27 are equally subjected to a resist etching step (i.e., ashing) to remove the thin resist portion 26 and leave the thick resist portion 27 as a remaining resist pattern 67. The ashing is carried out under the following conditions: gas pressure: 10 Pa; $O_2$ gas flow rate: 400 sccm; RF power: 1,500 W; etching time: 30 seconds. In this case, the first resist mask 23 thick resist portion shown in FIG. 7A is changed into a resist mask 31 and the silica film 30 is formed overhanging the resist mask 31.

Figure 8A:
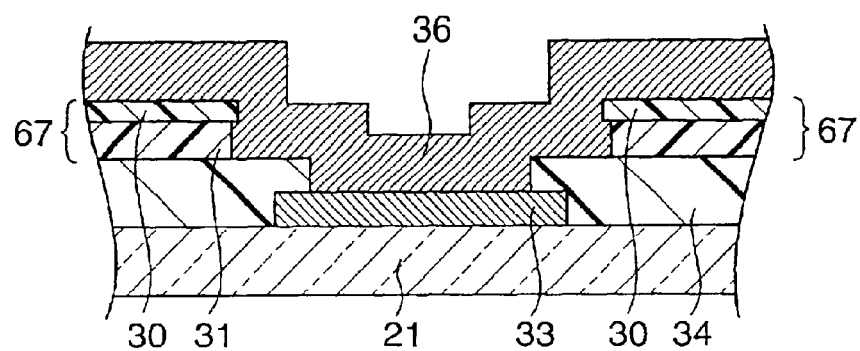
FIGS. 8A and 8B are cross sectional views showing process steps subsequent to FIG. 7B.

Note that also in this embodiment, instead of the two steps of performing the plasma treatment and the ashing, only one ashing step can be applied using the following conditions to oxidize the silylated film while removing the thin resist portion: gas pressure: 20 Pa; $O_2$ gas flow rate: 400 sccm; RF power: 1,500 W; etching time: 40 seconds As shown in FIG. 8A, an upper metal film 36 is deposited to cover the insulating film 34, the contact hole 35, the silica film 30 and the resist mask 31.

Figure 8B:
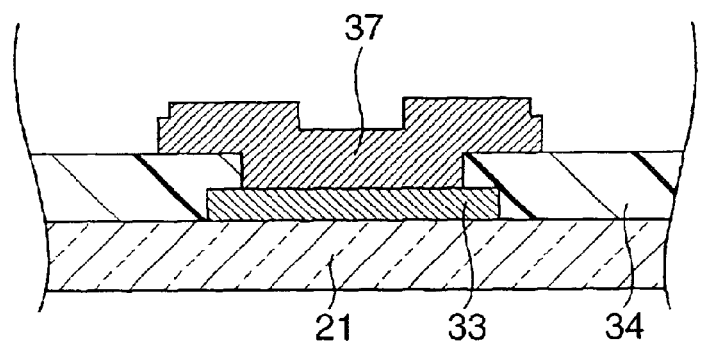

When the silica film 30 and the resist mask 31 are removed, the upper metal film 36 being in contact therewith is also removed to form an upper-layered wiring 37 connected to the lower-layered wiring 35 through the contact hole 35, as shown in FIG. 8B (this process step is equivalent to the second patterning step in this embodiment).

Figure 7B:
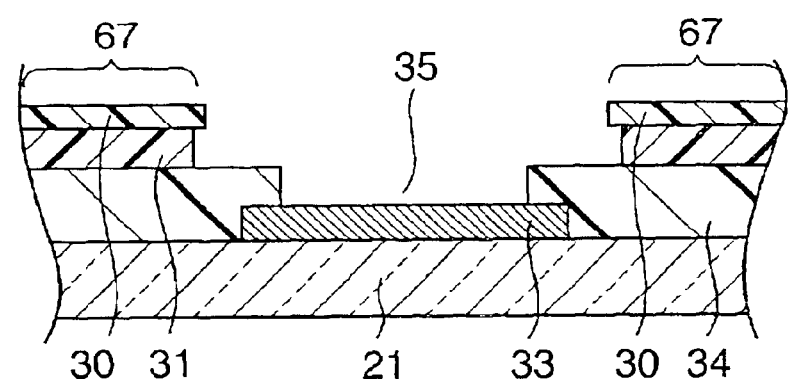

As is seen in this embodiment, the first patterning step is carried out in the process steps of FIG. 6B to FIG. 6C, and the resist etching step (ashing) is carried out in the process steps of FIG. 7A to FIG. 7B. The silica film 30 is formed such that the silylated film is oxidized by the plasma treatment that uses a gas mainly including oxygen. The silica film 30 is scarcely affected by the ashing that uses a gas including mainly $O_2$ gas. Therefore, the silica film 30 can maintain its planar shape nearly equal to that of the silica film 30 (i.e., the second resist film 24 out of the thick resist portion 27) before the ashing and the first resist film 23 under the silica film 30 is selectively etched to be located inside the silica film 30 to realize the resist structure capable of easily carrying out lift-off step. As a result, such resist structure enables the upper-layered wiring 37 to be formed nearly equal to the designed pattern with high controllability, thereby largely reducing probability of short circuit between the upper-layered wirings.

The third embodiment of the invention applying the first embodiment of the process for forming a pattern in accordance with the invention to formation of channel region in a lateral electric field liquid crystal display apparatus, will be described with reference to FIGS. 9A through 17C. FIG. 9 is for showing one pixel of the lateral electric field liquid crystal display apparatus and FIG. 9A is a plan view of a TFT substrate viewed from above, and FIG. 9B is a cross sectional view taken along the line A–A' in FIG. 9A through which a plane orthogonal to the TFT substrate passes while penetrating a liquid crystal and a CF substrate (a color filter substrate facing the TFT substrate is referred to as a CF substrate hereinafter) FIGS. 10A through 17C are cross sectional views of the TFT substrate of a lateral electric field liquid crystal display apparatus showing the manufacturing process steps in order, in which the figures denoted by A are cross sectional views taken along the line A–A' in FIG. 9A and the figures denoted by B and C, though not shown in FIG. 9A, are cross sectional views of a gate terminal for connecting the gate wiring to an associated external terminal and a drain terminal for connecting the drain wiring to another associated external.

The operation of the lateral electric field liquid crystal display apparatus will be briefly described with reference to FIGS. 9A and 9B.

On a first transparent substrate 101, gate wirings 153 including a gate electrode 133 are formed to be in parallel to each other, and a common electrode 173 is also formed thereon. The common electrode 173 is formed to have comb-shaped electrode portions which are opposed to comb-shaped electrode portions of the later-formed pixel electrode to generate an electric field therebetween. A gate insulating film 134 is formed on the gate wirings 153 and the common electrode 173, and drain wirings 138 are formed thereon to cross over the gate wirings 153. At the same time, the drain wirings 138 including a drain electrode 158, a source electrode 159 and the pixel electrode 139 consisting of an extended portion of the source electrode 159 and having comb-shaped electrode portions are formed thereon. A passivation film 140 is formed to cover the drain wiring 138, the source electrode 159 and the pixel electrode 139, and associated contact holes, though not shown in FIG. 9A, are formed therein at the end portions of the substrate to connect the gate wiring 153 and the drain wiring 138 to associated external terminals therethrough, the associated external terminals being provided for applying electrical signals.

Figure 9A:
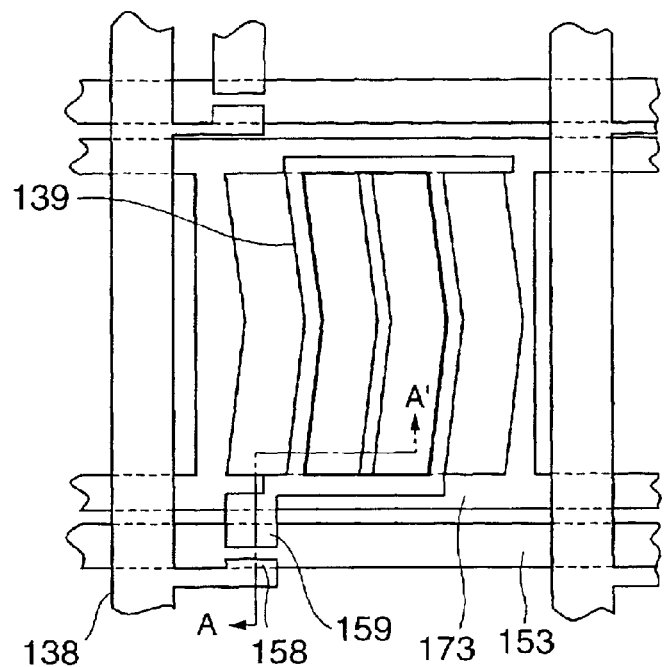
FIGS. 9A and 9B are a plan view and a cross sectional view, respectively, showing a third embodiment of the invention.
Figure 9B:
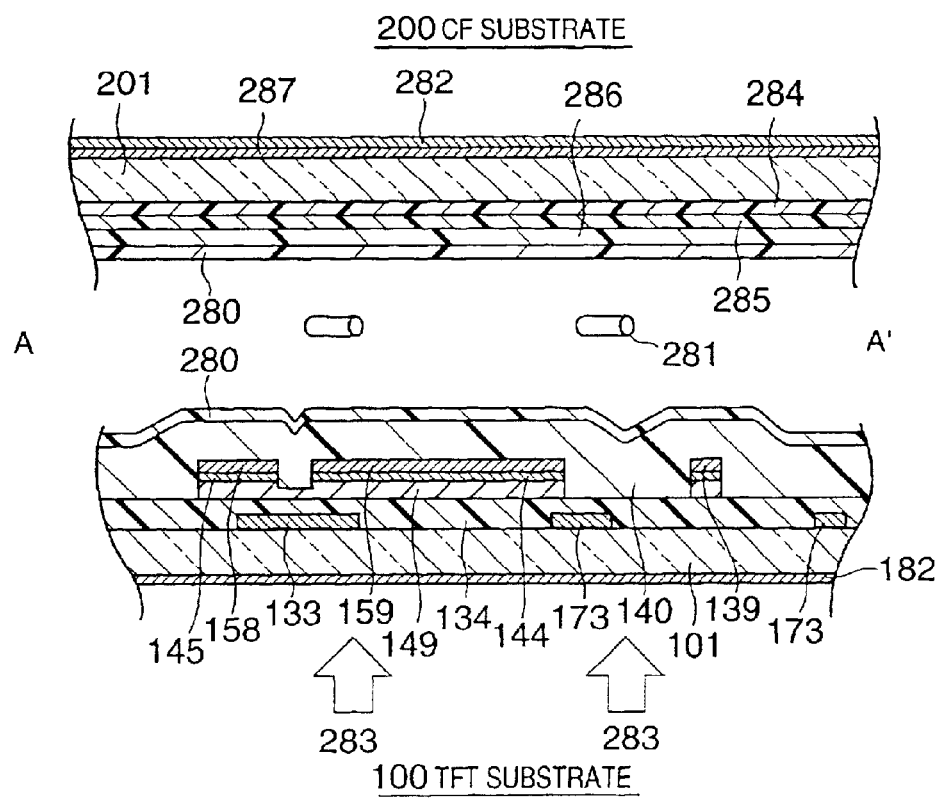

As shown in FIGS. 9A and 9B, the common electrode 173 is formed below the pixel electrode 139 interposing the gate insulating film therebetween to have electrodes in parallel with the pixel electrode and a certain voltage is applied therebetween to generate an electric field approximately in parallel with the surface of the first transparent substrate 101 to control the orientation of a liquid crystal 281 filled between the first transparent substrate 101 and a substrate opposed thereto.

A manufacturing process of the liquid crystal display apparatus of the third embodiment will be described with reference to FIGS. 10A through 17C.

A gate electrode 133 made of a metal such as Cr is formed on a first transparent substrate 101, and at this time, a common electrode 173 having comb-shaped electrodes and a gate terminal electrode 193 are formed on other regions of the first transparent substrate 101.

Figure 10A:
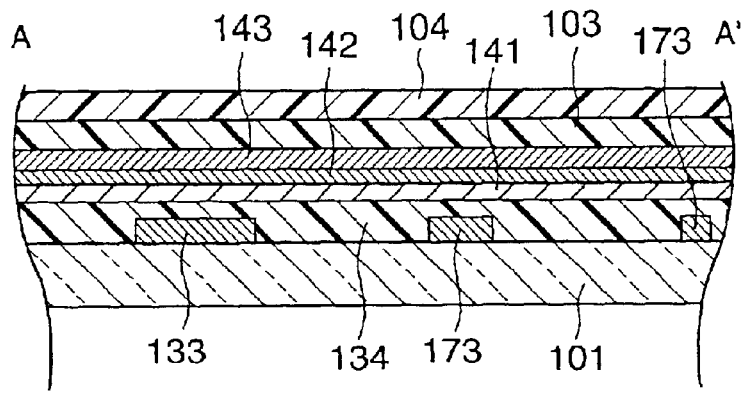
FIGS. 10A to 10C are cross sectional views of associated regions within the substrate different from each other at the point of a process step in accordance with the third embodiment of the invention.
Figure 10B:
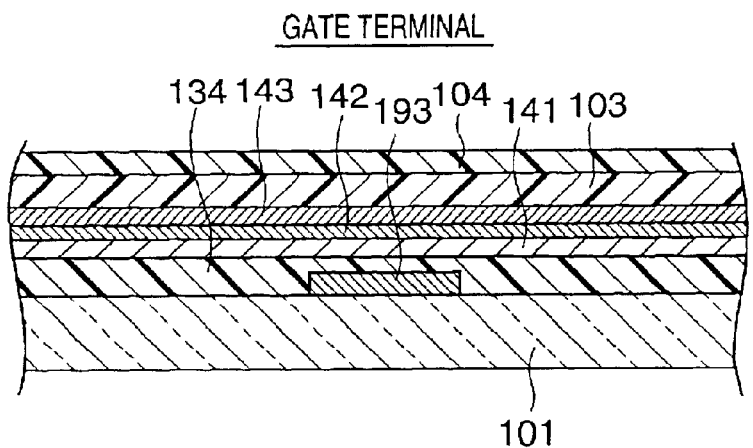
Figure 10C:
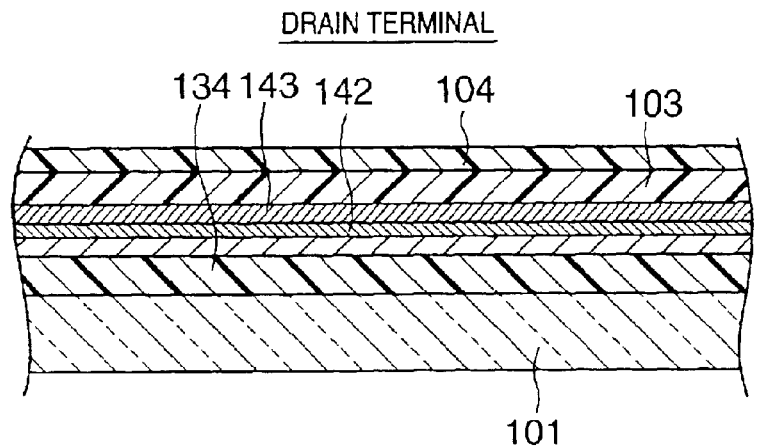

A silicon oxide film and a silicon nitride ($SiN_x$) film are then sequentially deposited on the whole surface of the first transparent substrate 101 to form a gate insulating film 134, and an a-Si film 141, an n+type a-Si film 142 and a metal film 143 made of a metal such as Cr for source/drain electrodes are deposited in order. Furthermore, a first resist film 103 made of positive resist having a thickness of about 500 nm and a second resist film 104 made of positive resist are formed on the metal film 143 (FIGS. 10A to 10C). In this case, the second resist film 104 is a resist film that can be silylated and has a thickness of about 300 nm.

Figure 11A:
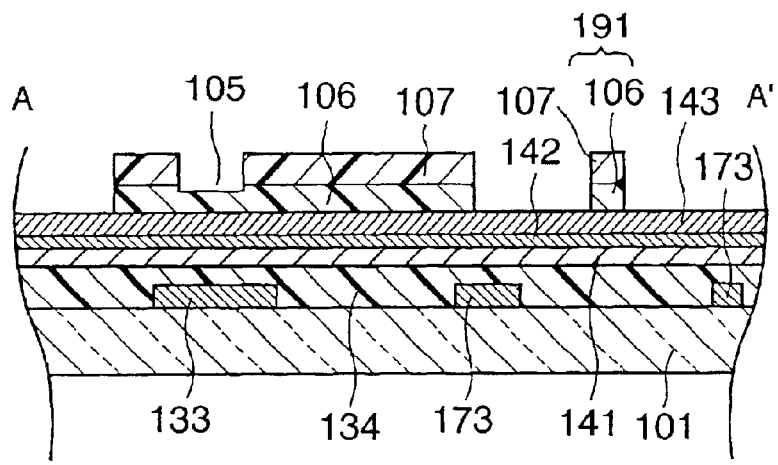
FIGS. 11A to 11C are cross sectional views of the associated regions within the substrate different from each other at the point of the process step subsequent to FIGS. 10A to 10C.
Figure 11B:
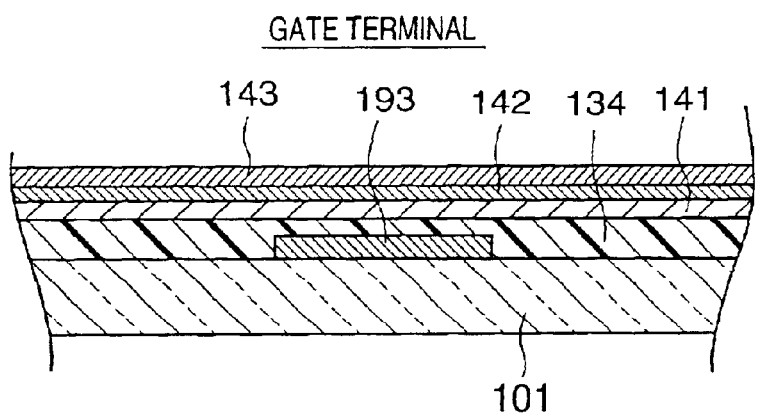
Figure 11C:
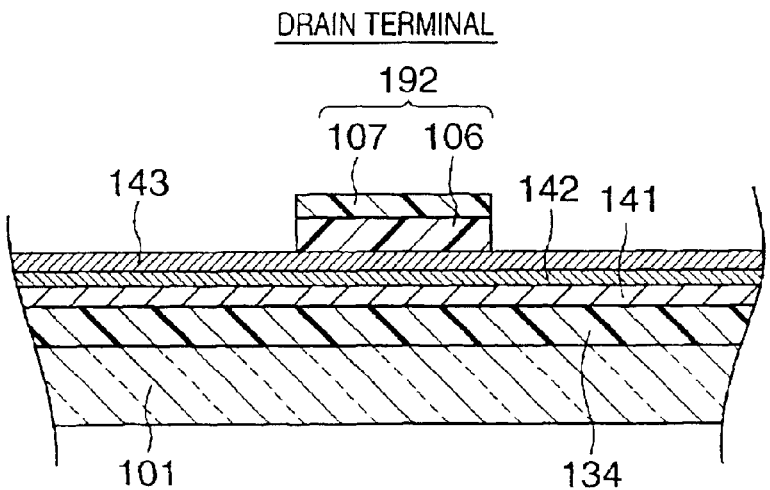

The first and second resist films are exposed by using, for example, a reticle having a light-shielding portion and a translucent portion as a mask and then developed to form a resist mask 106 made of the first resist film 103 and having a resist concave portion 105 therein above the gate electrode 133 corresponding to the translucent portion, and resist masks 107 made of the second resist mask 104 and interposing the concave portion 105 therebetween, as shown in FIGS. 11A to 11C. At this time, the resist mask 106 and the resist mask 107 laminated thereon are formed on a region 191, in which comb-shaped pixel electrode interposed between the comb-shaped electrodes of the common electrode 173 is to be formed, and a region 192, in which a drain terminal electrode is to be formed.

Figure 12A:
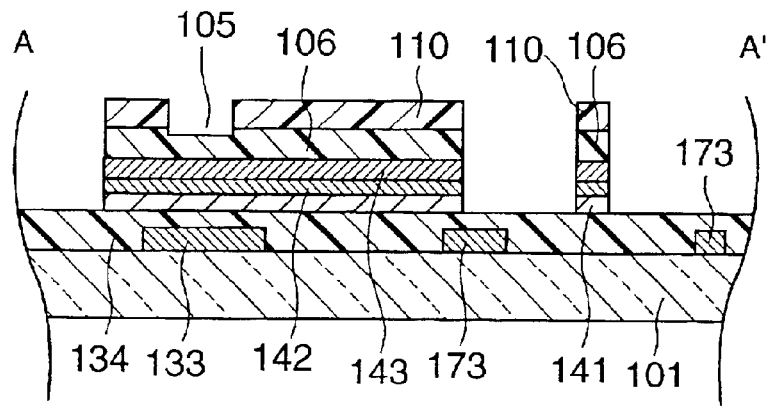
FIGS. 12A to 12C are cross sectional views of the associated regions within the substrate different from each other at the point of the process step subsequent to FIGS. 11A to 11C.
Figure 12B:
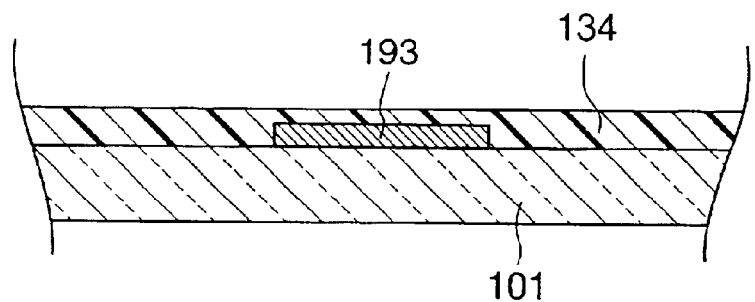

As shown in FIGS. 12A to 12B, the metal film 143, the n+ type a-Si film 142 and the a-Si film 141 are then etched and removed in order by using the resist masks 106 and 107 as a mask (the first patterning step).

The resist masks 106 and 107 are immersed in a silylating agent such as silazane to selectively silylate the resist mask 107 to form a silylated film 109. The silylated film 109 contains a large amount of silicon atoms. In this case, as the first resist film 103 is made of resist film free from being silylated, the surface of the resist mask 106 is not silylated.

Figure 12C:
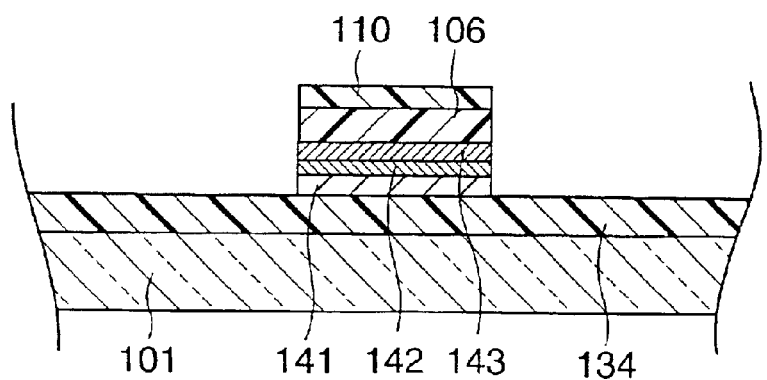
Figure 13A:
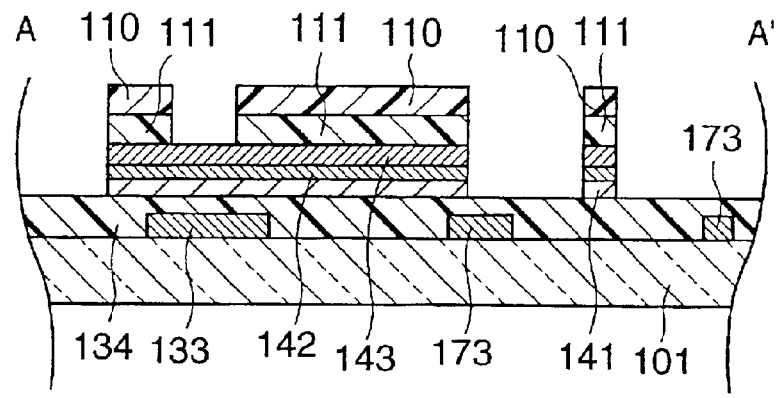
FIGS. 13A to 13C are cross sectional views of the associated regions within the substrate different from each other at the point of the process step subsequent to FIGS. 12A to 12C.
Figure 13B:
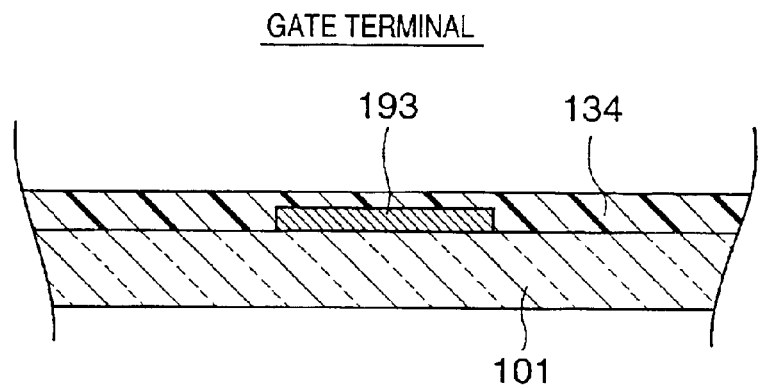
Figure 13C:
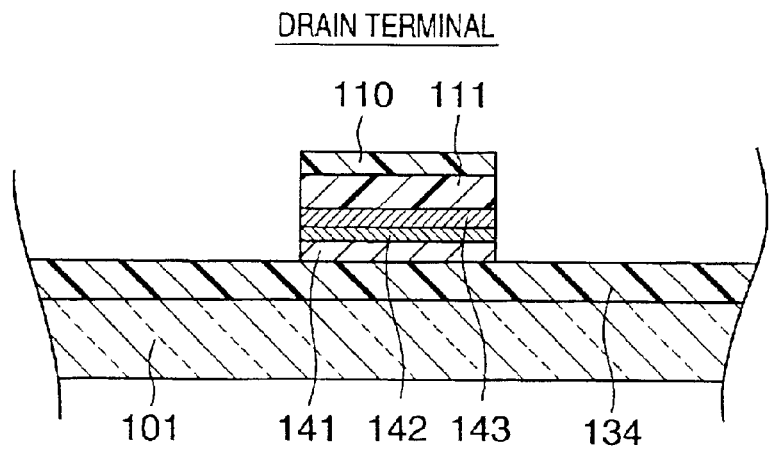

After the above-stated silylating reaction, a plasma treatment is carried out under the following conditions in the state shown in FIGS. 12A to 12C: gas pressure: 40 Pa; $O_2$/$SF_6$/He gas flow rate: 200/10/100 sccm; RF power: 1,500 W; etching time: 20 seconds. The above-described plasma treatment makes the silylated film oxidized changing into a silica film 110. The silica film 110 is formed such that silicon contained in the silylated film reacts with oxygen to change the silylated film into an oxide film.

Thereafter, ashing using the following conditions is carried out to remove the resist film under the resist concave portion 105 to expose the metal film 143 below the resist concave portion 105: gas pressure: 10 Pa; $O_2$ gas flow rate: 400 sccm; RF power: 1,500 W; etching time: 30 seconds. After removing of the concave portion, the resist mask 106 shown in FIG. 12A changed into a resist mask 111 shown in FIG. 13A.

Figure 14A:
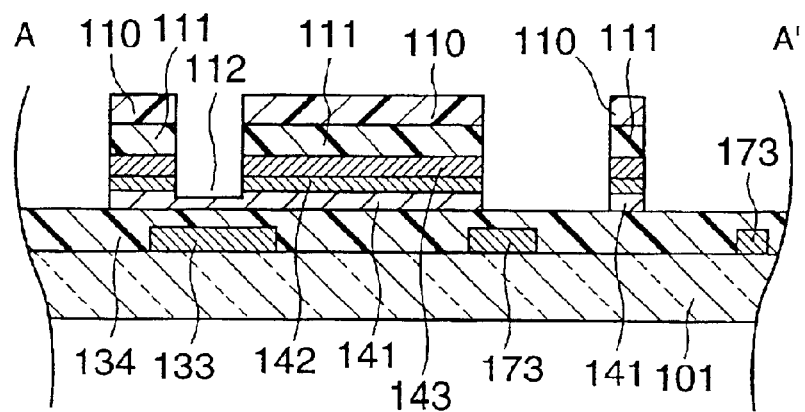
FIGS. 14A to 14C are cross sectional views of the associated regions within the substrate different from each other at the point of the process step subsequent to FIGS. 13A to 13C.
Figure 14B:
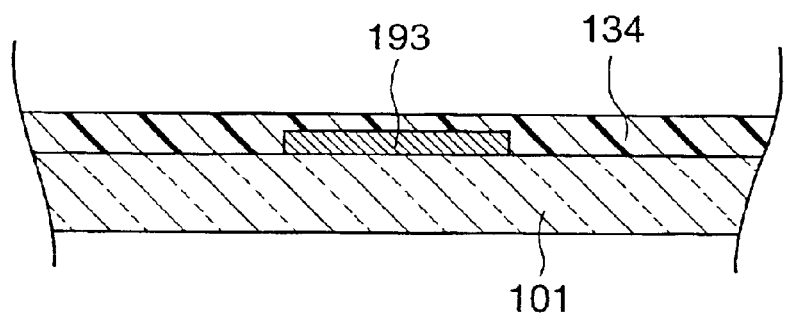
Figure 14C:
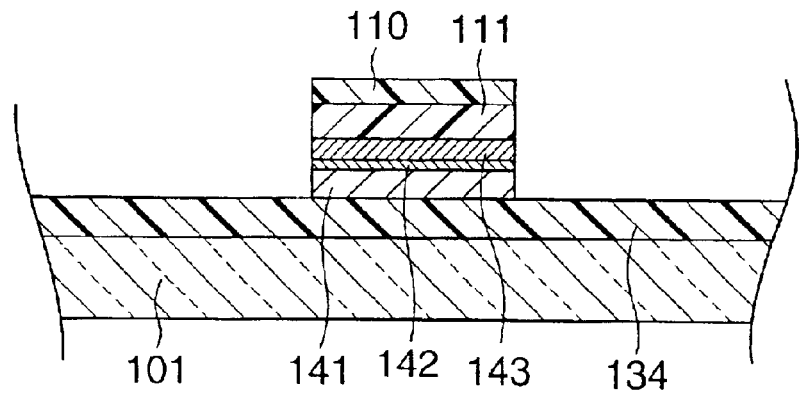

The exposed part of the metal film 143 is subjected to the second patterning step of etching and removing the metal film 143, the n+type a-Si film 142 and a part of the a-Si film 141 using a mixture of $SF_6$, HCl and He as a reactive gas by using the silica film 110 and the resist mask 111 as an etching mask. As shown in FIG. 14A, a concave portion 112 is thus formed in the a-Si film 141. In this case, the above-described dry etching is carried out under the following conditions: gas pressure: 30 Pa; gas flow rate of $SF_6$/HCl/He: 50/100/200 sccm; RF power: 800 W; etching time: 60 seconds.

Figure 15A:
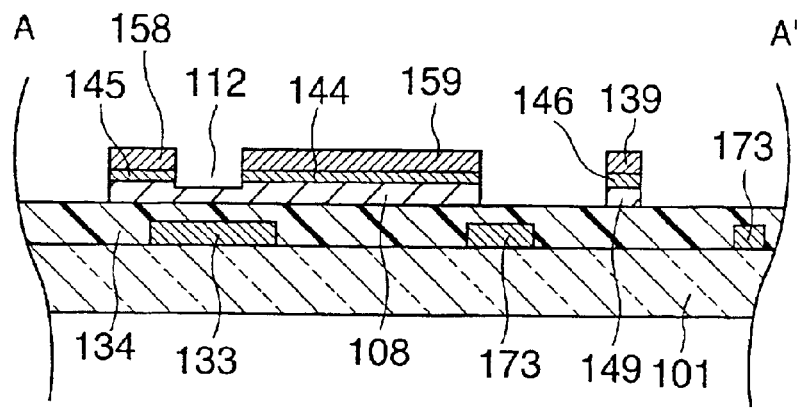
FIGS. 15A to 15C are cross sectional views of the associated regions within the substrate different from each other at the point of the process step subsequent to FIGS. 14A to 14C.
Figure 15B:
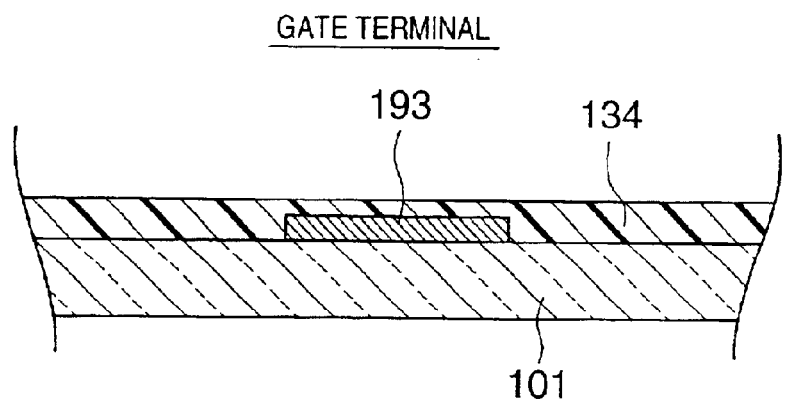
Figure 15C:
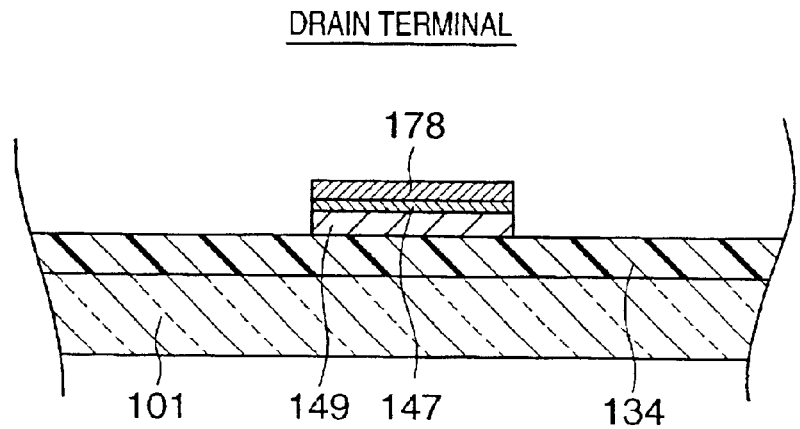

The silica film 110 and the resist mask 111 are then removed, and thus a source electrode 159, an ohmic layer 144, a drain electrode 158, an ohmic layer 145, an island 108 of TFT having the concave portion 112, a pixel electrode 139, a drain terminal electrode 178 and an ohmic layer 147 are formed, as shown in FIGS. 15A and 15C.

As is seen in this embodiment, the first patterning step is carried out in the process steps of FIGS. 11A–11C to FIG. 12A, and the resist etching step (ashing) is carried out in the process steps of FIGS. 12A–12C to FIG. 13A. The silica film 110 is formed such that the silylated film is oxidized by the plasma treatment that uses a gas mainly including oxygen. The silica film 110 is scarcely affected by the ashing that uses a gas including mainly $O_2$ gas. Therefore, the silica film 110 can maintain its planar shape nearly equal to that of the silica film 110 (i.e., the resist mask 107) before the ashing. As a result, the resist mask 107 is formed nearly equal to the designed pattern with high controllability to thereby form the concave portion 112 nearly equal to the designed pattern. Accordingly, the pixel electrode 139 and the drain terminal electrode 178 can be formed approximately equal to the designed pattern since the pixel electrode 139 and the drain terminal electrode 178 are formed by using the silica film 110 and the resist mask 111 as a mask, both of which are patterned with high accuracy.

Figure 16A:
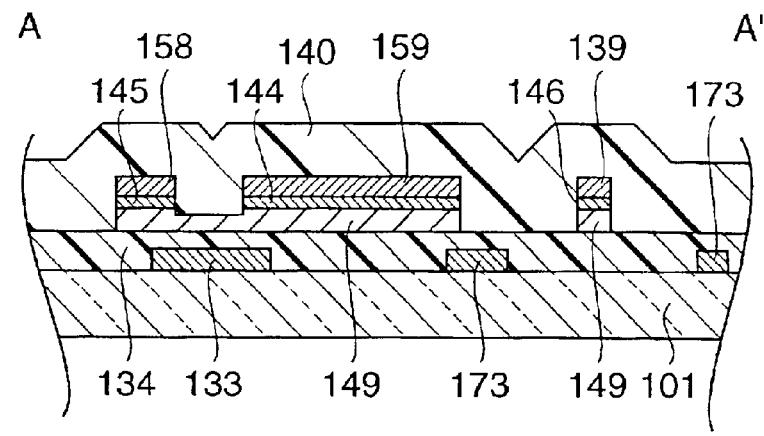
FIGS. 16A to 16C are cross sectional views of the associated regions within the substrate different from each other at the point of the process step subsequent to FIGS. 15A to 15C.
Figure 16B:
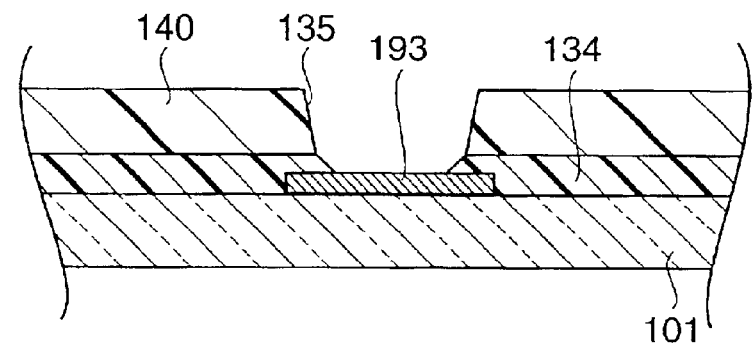
Figure 16C:
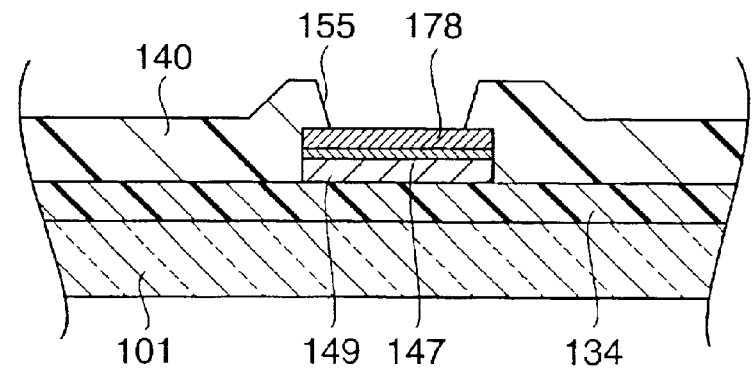

After forming a passivation film 140, contact holes 135 and 155 are formed therein on the gate terminal electrode 193 at the gate terminal and the drain terminal electrode 178 at the drain terminal through a photolithography step and a dry etching step under the following conditions: gas flow rate of $SF_6$/He: 50/150 sccm; gas pressure: 10 Pa; RF power: 1,000 W; etching time: 250 seconds. In this case, the contact hole 135 penetrates the gate insulating film 134 and the passivation film 140 at the gate terminal, and the contact hole 155 penetrates only the passivation film 140 at the drain terminal, as shown in FIGS. 16A to 16C.

Figure 17A:
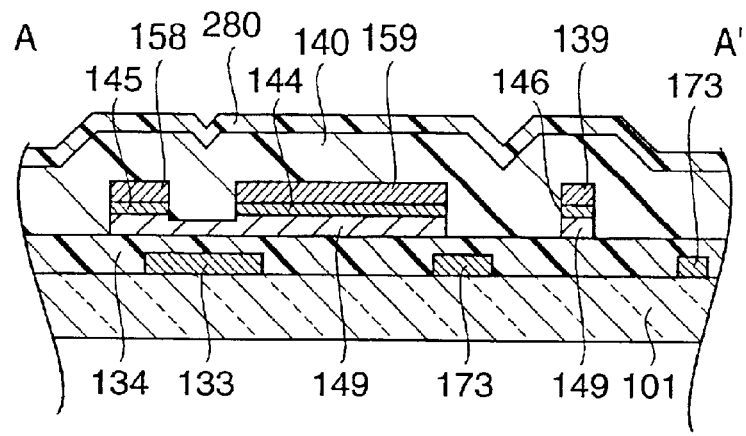
FIGS. 17A to 17C are cross sectional views of the associated regions within the substrate different from each other at the point of the process step subsequent to FIGS. 16A to 16C.
Figure 17B:
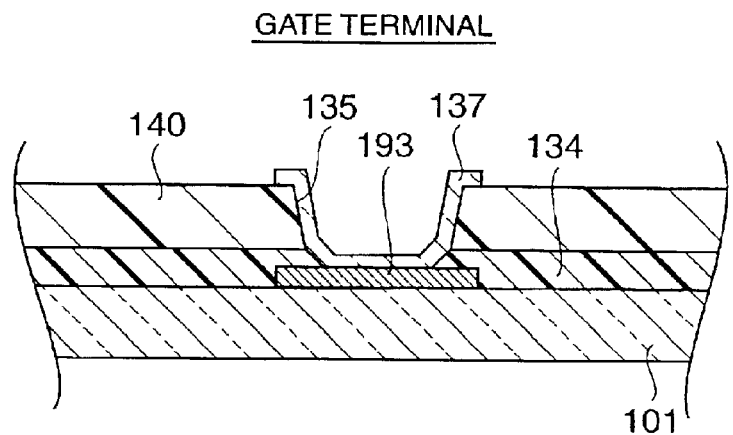
Figure 17C:
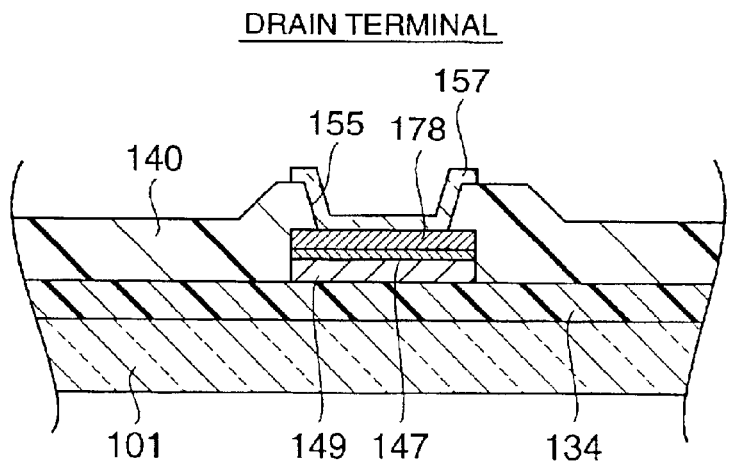
Figure 18A:
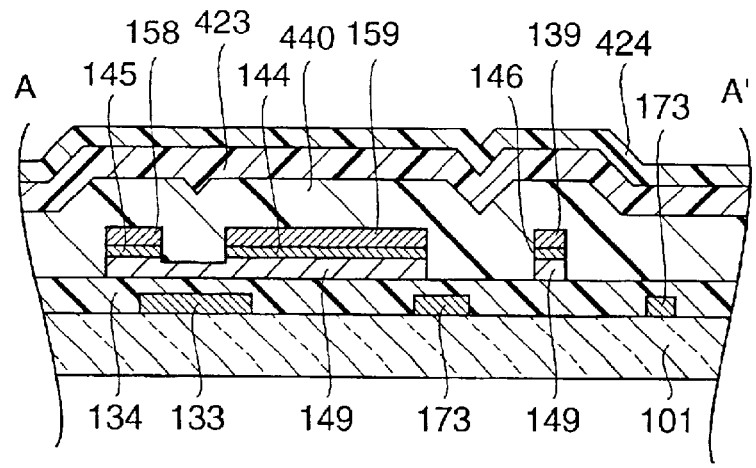
FIGS. 18A to 18C are cross sectional views of associated regions within the substrate different from each other at the point of a process step in accordance with the fifth embodiment of the invention.
Figure 18B:
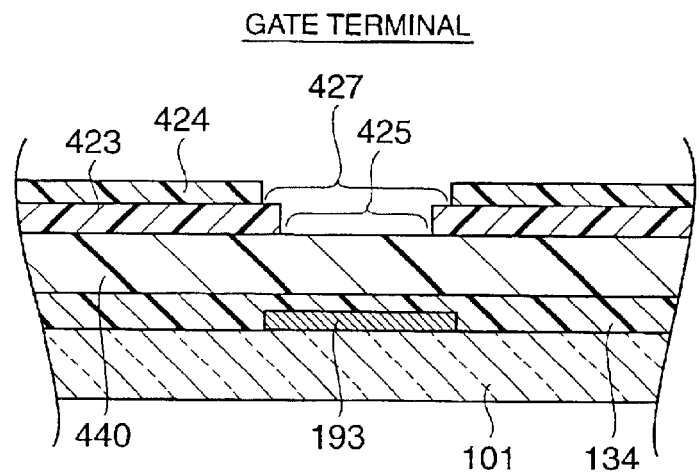
Figure 18C:
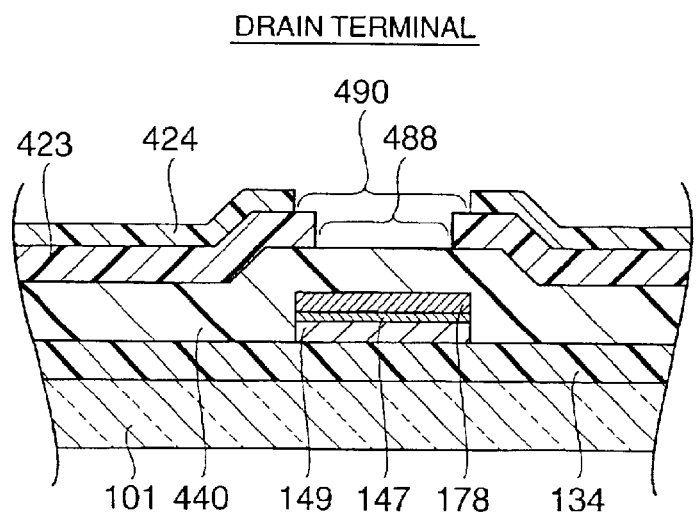

After depositing a transparent metal film such as ITO to cover the contact holes 135 and 155, a gate terminal transparent electrode 137 and a drain terminal transparent electrode 157 are formed through a photolithography step and an etching step using a ferric chloride series etching solution to reduce the wiring takeoff resistance at the terminals, and thereafter, the surface of the substrate used for display excluding the surface thereof for terminals is covered by an alignment layer 280 as shown in FIGS. 17A to 17C.

Finally, a polarizer 182 is formed on a back surface of the first transparent substrate 101 (the surface of the first transparent substrate 101, on which the TFT is not formed, is referred to as a back surface) to complete fabrication of a TFT substrate of a lateral electric field liquid crystal display apparatus, as shown in FIGS. 9A and 9B.

The liquid crystal display apparatus carries out colored display by emitting a light 283 from the back side of the first transparent substrate 101 to a color filter (hereinafter abbreviated as CF) substrate 200 disposed facing the TFT substrate 100, as shown in FIG. 9B.

The CF substrate 200 is formed in the following manner. That is, a black matrix 284, a color layer 285, a second insulating film 286 made of such as silicon nitride ($SiN_x$) film are formed in order on one surface of a second transparent substrate 201 made of a transparent insulating material such as glass, and an electrically conductive film 287 and a polarizer 282 are formed in order on the other surface of the second transparent substrate 201. An alignment layer 280 is printed on the surface of the uppermost layer of the substrate such as by offset printing.

The TFT substrate 100 and the CF substrate 200 thus obtained are subjected to a rubbing treatment to align the molecules of the alignment layer in a prescribed direction, and the two substrates are disposed to have a prescribed gap therebetween with the aid of a material to generate a cell gap to house a liquid crystal 281 therebetween.

The pixel electrode 139 and the common electrode 173, both being formed to have comb-shaped electrodes to substantially generate an electric field parallel to the surface of the TFT substrate 100, are spaced about 7 μm from one another.

The polarizer 182 and 282 are formed to have a thickness of about 0.2 mm. The electrically conductive film 287 is formed to have a thickness of about 50 nm. The first and second transparent substrates are formed to have a thickness of about 0.7 mm. The black matrix 284 is formed to have a thickness of about 1 μm. The color layer 285 is formed to have a thickness of about 1 μm. The second insulating film 286 is formed to have a thickness of about 1 μm. The alignment layer 280 is formed to have a thickness of about 50 nm. The gate insulating film 134 is formed to have a thickness of about 500 nm. The passivation film 140 is formed to have a thickness of about 300 nm. The common electrode 173 is formed to have a thickness of about 400 nm. The thickness of a layer consisting of the liquid crystal 281 (cell gap) is made to be 4.5 μm by disposing spacers within the cell at an appropriate dispersion density.

The liquid crystal panel thus obtained carries out full colored display ranging from black-colored display to white-colored display in the following manner. That is, the light transmission axis of the polarizer 182 of the TFT substrate 100 is aligned in an alignment direction of liquid crystal, the alignment direction being determined by the rubbing treatment, and the polarizer 282 having a light absorption axis perpendicular to that of the polarizer of the TFT substrate 100 is attached to the CF substrate 200. In addition to it, a light 283 is emitted from the side of the TFT substrate 100 while a potential is intentionally applied between the pixel electrode 139 and the common electrode 173 to control colors to be displayed.

A fourth embodiment of the invention, in which the process for forming a pattern in accordance with the second embodiment of the invention is applied to a lateral electric field liquid crystal display apparatus, will be described with reference to FIGS. 18A to 22C. This embodiment is different from the third embodiment in the process steps of forming contact holes and subsequently forming a gate terminal transparent electrode and a drain terminal transparent electrode. Therefore, when the third embodiment and this embodiment are simultaneously applied to the associated process steps of forming a lateral electric field liquid crystal display apparatus, whole process steps of the liquid crystal display apparatus are further reduced while improving yield thereof. Also in this embodiment, FIGS. 18A to 22C are cross sectional views showing the manufacturing process steps of forming the TFT substrate of a lateral electric field liquid crystal display apparatus in order, in which the figures denoted by A are cross sectional views taken along the line A–A' in FIG. 9A, and the figures denoted by B and C, though not shown in FIG. 9A, are cross sectional views of a gate terminal for gate wiring and a drain terminal for drain wiring, both terminals being provided to communicate with associated external devices. In this embodiment, as the process steps of forming the source electrode and the drain electrode are the same as those explained about the process steps in the third embodiment shown in FIGS. 10A to 15C, through which the back channel is formed, and therefore, explanation of the process steps is omitted, and process steps from deposition of a passivation film covering the source and drain electrodes onward will be described below.

After depositing a passivation film 440 on the surface of the substrate shown in FIGS. 15A to 15C, a positive and first resist film 423 and having a film thickness of about 500 nm and a positive and second resist film 424 that can be silylated and has a film thickness of about 300 nm are formed on the passivation film 440. The first and second resist films are exposed by using, for example, a reticle having a light-shielding portion and a translucent portion as a mask, and then developed to form openings 425, 427 and openings 488, 490 therein above the gate terminal electrode 193 and the drain terminal electrode 178 respectively. In this case, the openings 425, 488 are formed corresponding to a transparent portion of the reticle and the openings 427, 490 are formed corresponding to a translucent portion thereof to include the openings 425, 488, respectively therein (refer to FIGS. 18A to 18C).

Figure 19A:
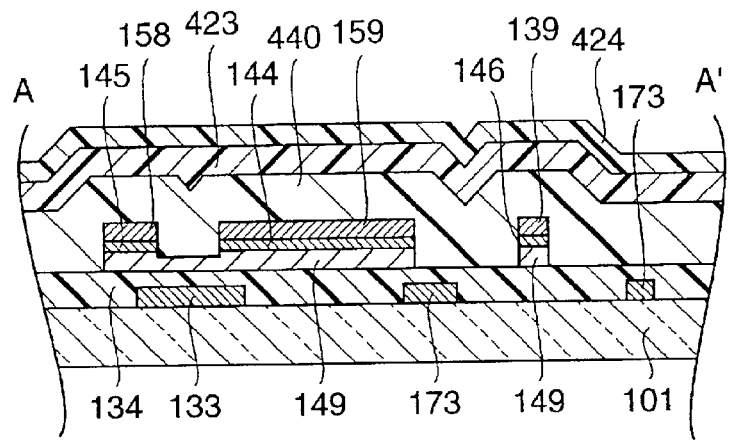
FIGS. 19A to 19C are cross sectional views of the associated regions within the substrate different from each other at the point of the process step subsequent to FIGS. 18A to 18C.
Figure 19B:
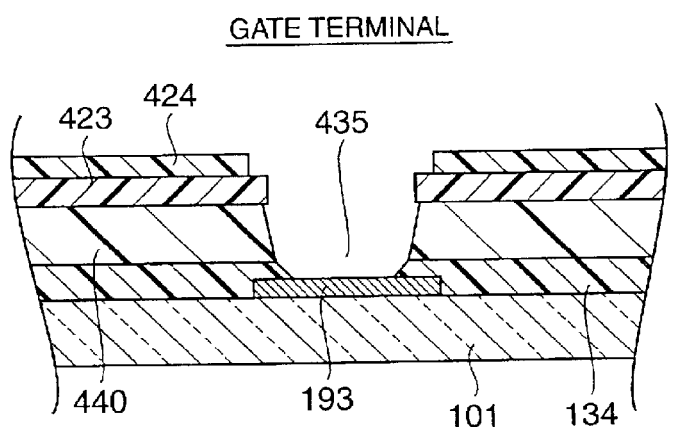
Figure 19C:
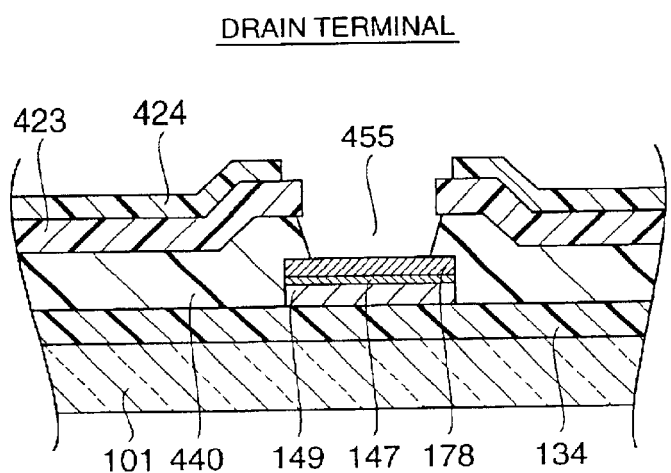

The passivation film 440 and the gate insulating film 134 above the gate terminal electrode and the passivation film 440 above the drain terminal electrode 178 are etched and removed by using the first resist film 423 and the second resist film 424 as a mask to expose surfaces of the gate terminal electrode and the drain terminal electrode and to form contact holes 435, 455, respectively (the first patterning step; refer to FIGS. 19A to 19C).

The first resist film 423 and the second resist film 424 are immersed in a silylating agent such as silazane to selectively silylate the second resist film 424 to form a silylated film. The silylated film contains a large amount of silicon atoms. In this case, the surface of the first resist film 423 is not silylated since the first resist film 423 is made of a resist film free from being silylated.

After the above-stated silylating reaction, a plasma treatment is carried out under the following conditions in the state shown in FIGS. 19A to 19C: gas pressure: 40 Pa; $O_2/SF_6$/He gas flow rate: 200/10/100 sccm; RF power: 1,500 W; etching time: 20 seconds. The above-described plasma treatment makes the silylated film oxidized changing into a silica film 430. The silica film 430 is formed such that silicon contained in the silylated film reacts with oxygen to change the silylated film into an oxide film.

Figure 20A:
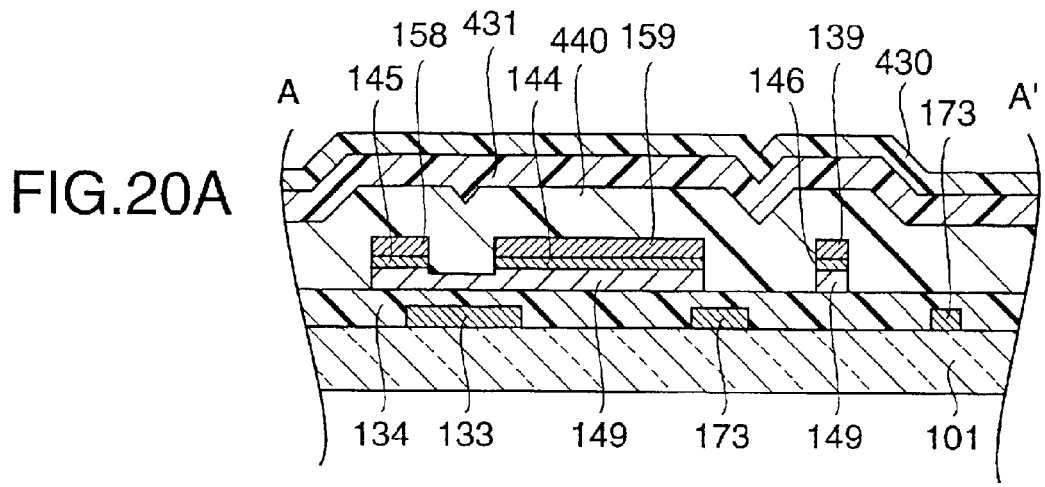
FIGS. 20A to 20C are cross sectional views of the associated regions within the substrate different from each other at the point of the process step subsequent to FIGS. 19A to 19C.
Figure 20B:
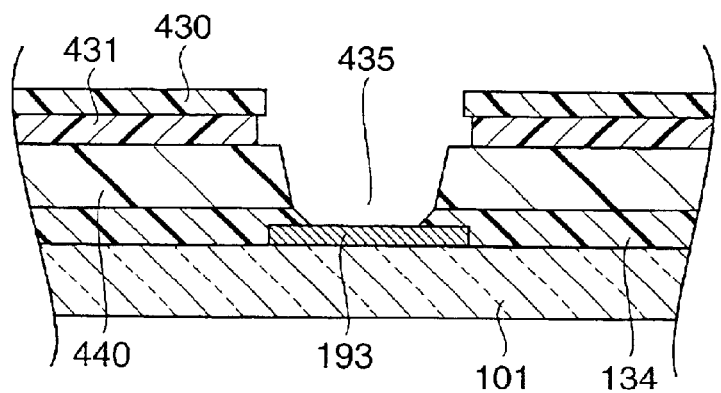
Figure 20C:
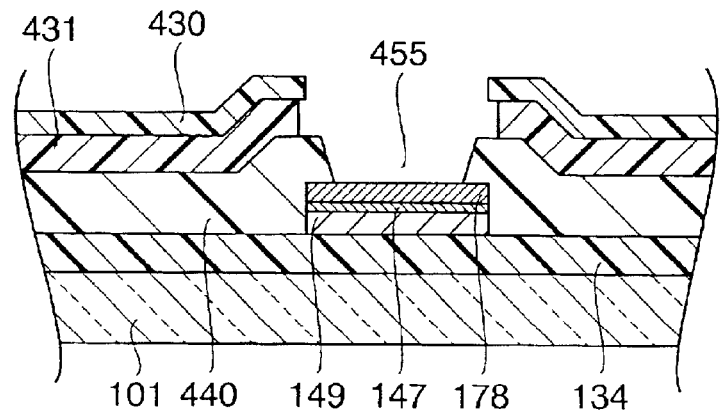

Thereafter, as shown in FIGS. 20A to 20C, ashing using the following conditions is carried out to remove the first resist film 423 around the openings 435, 455 to expose the surface of the passivation film 440: gas pressure: 10 Pa; $O_2$ gas flow rate: 400 sccm; RF power: 1,500 W; etching time: 30 seconds. In this case, the first resist film 423 shown in FIGS. 19B, 19C is changed into a resist mask 431 shown in FIGS. 20B, 20C to form an overhang of the silica film 430 with respect to the resist mask 431 since the silica film 430 is rarely etched and on the contrary, the first resist film 423 is easily etched during the ashing.

Figure 21A:
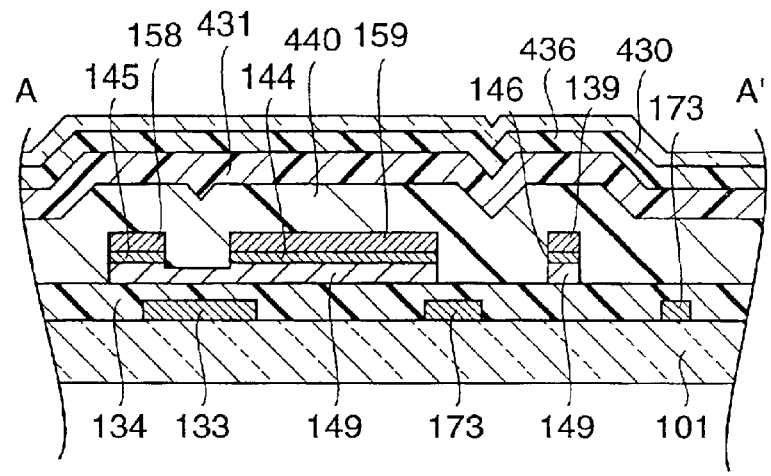
FIGS. 21A to 21C are cross sectional views of the associated regions within the substrate different from each other at the point of the process step subsequent to FIGS. 20A to 20C.
Figure 21B:
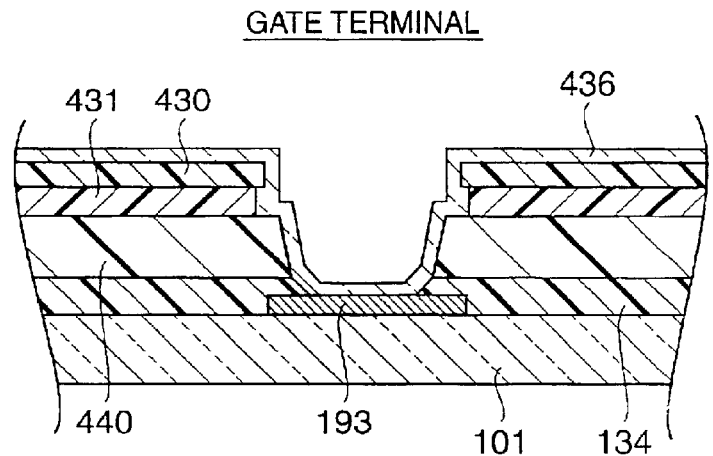
Figure 21C:
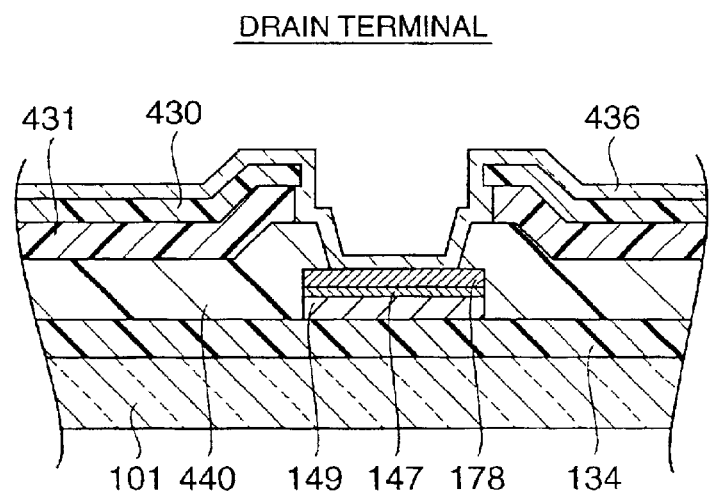
Figure 22A:
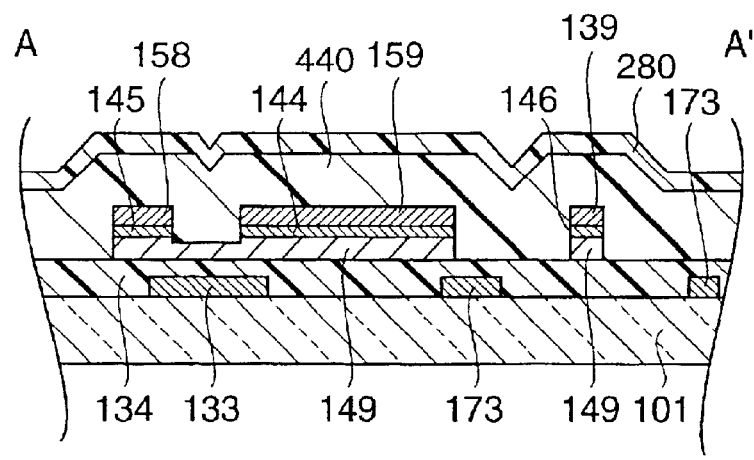
FIGS. 22A to 22C are cross sectional views of the associated regions within the substrate different from each other at the point of the process step subsequent to FIGS. 21A to 21C.
Figure 22B:
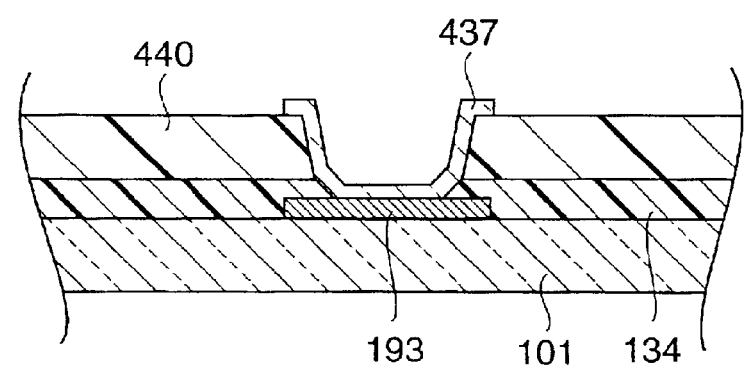
Figure 22C:
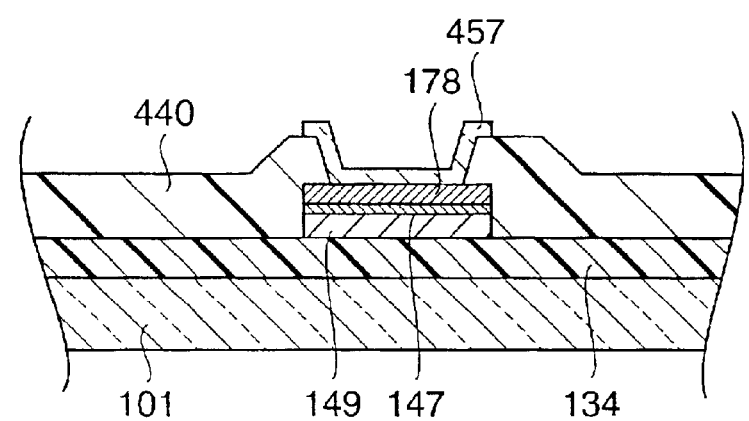

A transparent metal film 436 such as ITO is deposited to cover the passivation film 440 including the openings 435, 455 therein, the silica film 430 and the resist mask 431 (refer to FIGS. 21A to 21C).

When the silica film 430 and the resist mask 431 there under shown in FIGS. 21B and 21C are removed, the transparent metal film 436 being in contact therewith is also removed to form a gate terminal transparent electrode 437 on the gate terminal electrode 193 via the opening 435 and a drain terminal transparent electrode 457 on the drain terminal electrode 178 via the opening 455 (this step is equivalent to the second patterning step). Thereafter, an alignment layer 280 is formed to cover the passivation film 440, thereby completing a TFT substrate of a lateral liquid crystal display apparatus (refer to FIGS. 22B and 21C).

As is seen in this embodiment, the first patterning step is carried out in the process step shown in FIGS. 19A to FIG. 19C, and the resist etching step (ashing) is carried out in the process step shown in FIGS. 20A to 20C. As the silica film 430 exposed to the ashing is being changed into a film rarely affected by the ashing that uses oxygen gas, the silica film 430 can maintain its planar shape nearly equal to that of the silica film 430 (i.e., the second resist film 424) before the ashing and make it possible for the resist mask 431 under the silica film 430 to be located inside the silica film 430 to realize the resist structure capable of easily carrying out lift-off step. As a result, such resist structure enables the transparent metal film 436 to be formed nearly equal to the designed pattern with high controllability, thereby largely reducing probability of short circuit between the transparent metal film 436.

It should be noted that the present invention is not limited to the embodiments described so far. That is, in the embodiments, the second resist film is formed having greater resistance against etching compared to the first resist film or in other words, is modified to be a modified resist film. To form such resist film having resistance against etching, the second resist film as an upper-layered film that can be silylated is employed and immersed in a silylating agent to be silylated, and further, modified to become silicon oxide film having resistance against dry-etching by dry-etching using a gas including oxygen. Other than the above-described method of making the second resist film have resistance against dry-etching, (1) the second resist film is formed by coating a resist film made of material inherently having resistance against dry-etching or (2) the second resist film is formed such that a resist film to be modified during dry-etching is previously selected and then, the resist film is coated as the second resist film. The above-stated methods will be described below.

(1) In the case where the second resist film is formed by coating a resist film made of material inherently having resistance against dry-etching.

When both the first resist film and the second resist film are made of an organic material, in proportion to the amount of benzene rings contained in the organic material, resistance of the organic material against dry-etching increases in the following order.

(a) Novolak resin (e.g., cresol novolak resin and organic material formed by mixing cresol novolak resin and naphthoquinone-5-sulfonic acid ester)

(b) Aromatic bisazide-rubber system (e.g., cyclized polyisoprene and organic material formed by mixing cyclized polybutadiene and bisazide compound)

(c) Cinnamate (d) Chloromethylated polystyrene (e) Methyl methacrylate (f) Acrylic acid copolymer system (e.g., polyacrylamide and polyamide acid (g) Polyvinyl system (e.g., polyglycidylmethacrylate and polyvinyl cinnamate)

Accordingly, an organic material having lower resistance against dry-etching, for example, a polyvinyl series organic material shown in the item (g) is selected as the first resist film, and an organic material having higher resistance against dry-etching, for example, a novolak resin shown in the item (a) is selected as the second resist film.

(2) In the case where the second resist film is formed such that a resist film to be modified during dry-etching is previously selected and then, the resist film is coated as the second resist film.

For example, one of the organic materials shown in the items (a) to (g) is selected as the first resist film, and a resist film containing the following inorganic materials is coated as the second resist film.

(h) Resist containing Si (e.g., resist containing siloxane, polysiloxane, polysilane, polysilyne or carbosilane)

(i) Resist containing metal (e.g., germanium, chalcogenide glass (e.g., Se-Ge thin film), metallic halide (e.g., cadmium chloride, aluminum fluoride, LiF and LiF doped with $AlF_3$))

The dry-etching step of the first resist film is carried out by using one of an $O_2$ gas, a fluorine series gas and a mixture of an $O_2$ gas and a fluorine series gas as a plasma treatment gas. In the case where a fluorine series gas is used as the plasma treatment gas, the fluorine series gas is a gas containing one of $SF_6$, $CF_4$ and $CHF_3$, and in the case where a mixture of an $O_2$ gas and a fluorine series gas is used as the plasma treatment gas, the mixture of an $O_2$ gas and a fluorine series gas is a gas containing one of an $SF_6/O_2$ gas, an $CF_4/O_2$ gas and an $CHF_3/O_2$ gas.

The present invention is not limited to the lateral electric field liquid crystal display apparatus described so far and therefore, can easily be applied to a vertical electric field liquid crystal display apparatus (for example, a contact hole on a source electrode of a TFT).

Although the third and fourth embodiments employ a regular type of inversely staggered TFT, the process for forming a pattern in accordance with the invention is not limited to form such inversely staggered TFT and can be applied to a process for forming a TFT with the addition of color filter, the TFT being formed together with a color filter layer below a pixel electrode or a color filter layer and a planarizing film thereon.

Finally, the first to fourth embodiments of the invention can be used as a manufacturing process of an electroluminescence display apparatus (EL), a field emission display (FED), a fluorescent display apparatus, an active element substrate of a plasma display panel (PDP) and a substrate having an integrated circuit thereon.

As described so far, in the process for forming a pattern and the method for forming a liquid crystal display apparatus using the same in accordance with the present invention, in order to reduce the number of PR process steps employed in the conventional technique, which utilizes difference in film thicknesses of a resist mask, from two to one, after carrying out the first etching step of etching a film to be etched by using the resist mask, a thin resist portion of the resist mask, which is formed to have a film thickness thinner than that of a thick resist portion of the resist mask, is removed for the resist mask to become another resist mask to be used in the second etching step, the another resist mask being different from the resist mask. Before removing the thin resist portion of the resist mask, the surface layer of the thick resist portion is modified to a modified layer having resistance against dry-etching and therefore, the thick resist portion maintains its planar shape nearly equal to that of the thick resist portion before the removal of the thin resist portion. Accordingly, the film to be etched is subjected to the second etching step to have a pattern thereof nearly equal to the designed pattern since the film to be etched is patterned by using the thick resist portion as an etching mask and therefore, it is concluded that the process steps can be simplified by reducing the number of PR process steps applying one resist mask having thick and thin resist portions thereof to two etching steps while preventing the thick resist portion to be used in the second etching step from changing even after removal of the thin resist portion.

What is claimed is:

1. A process for forming a pattern comprising:
    a resist pattern formation step of coating a first resist film and a second resist film in order on a film to be etched on a substrate, and further, forming an initial resist pattern by patterning said first resist film and said second resist film to make coverage of said first resist film greater in size than said second resist film;
    a first patterning step of etching said film to be etched to form a first pattern in said film to be etched by using said resist pattern as a mask; and
    a resist etching step of etching said initial resist pattern to remove at least a portion of said first resist film, said portion being not covered by said second resist film, to thereby form a remaining resist pattern consisting of said first resist film and said second resist film, said resist etching step further being constructed such that said second resist film is in a state of a resist film having higher resistance against dry-etching than that of said first resist film at least during said resist etching step.

2. The process for forming a pattern according to claim 1, wherein said initial resist pattern includes a first opening formed in said first resist film and a second opening formed in said second resist film in said resist pattern formation step, said first opening is formed inside said second opening, and said remaining resist pattern is formed to have an overhang of said second resist film with respect to said first resist film in said resist etching step.

3. The process for forming a pattern according to claim 1, wherein said second resist film is coated as a resist film having higher resistance against an etchant used in said resist etching step than that of said first resist film in said resist pattern formation step of coating said first resist film and said second resist film.

4. The process for forming a pattern according to claim 1, wherein said initial resist pattern is subjected to a plasma treatment step to modify said second resist film using a plasma treatment gas to change said second resist film into a modified resist film having higher resistance against dry-etching than that of said first resist film between said first patterning step and said resist etching step.

5. The process for forming a pattern according to claim 4, wherein said plasma treatment step employs one of a gas containing an $O_2$, a gas containing a fluorine series gas and a gas containing a mixture of an $O_2$ gas and a fluorine series gas, as said plasma treatment gas.

6. The process for forming a pattern according to claim 4, wherein said resist etching step is further constructed such that said second resist film is made to include silicon atoms to change said second resist film into a silicon-doped second resist film and then, said silicon-doped second resist film is modified to a silicon oxide film through said plasma treatment step using a mixed gas containing at least oxygen.

7. The process for forming a pattern according to claim 6, wherein said second resist film previously consists of a resist film capable of being silylated and between said first patterning step and said plasma treatment step, a silylating step of immersing said first resist film and said second resist film in a silylating agent containing silazane to silylate only said second resist film is carried out.

8. The process for forming a pattern according to claim 1, wherein said second resist film is modified to a modified resist film having higher resistance against dry-etching than that of said first resist film, while removing at least a portion of said first resist film, said portion being not covered by said second resist film, in said resist etching step.

9. The process for forming a pattern according to claim 1, wherein a second patterning step of etching said film to be etched to form a second pattern in said film to be etched is carried out by using said remaining resist pattern as a mask after said resist etching step.

10. The process for forming a pattern according to claim 1, wherein a gate wiring and a gate insulating film covering said gate wiring are formed on said substrate and under said film to be etched, said film to be etched is a laminated film formed by depositing a semiconductor film, a semiconductor film doped with impurities and a metal film for source/drain electrodes in order on said gate insulating film, and said resist pattern is formed on said laminated film.

11. The process for forming a pattern according to claim 10, wherein said resist pattern is formed such that a resist film out of said resist pattern, said resist film consisting of only said first resist film, is positioned above a later-formed channel region of a thin film transistor, at least said metal film for source/drain electrodes is etched and removed to form an electrode pattern made of said metal film for source/drain electrodes in said step of subjecting said film to be etched to said first patterning step by using said resist pattern as a mask, said resist pattern is etched to remove only said resist film consisting of only said first resist film to make said resist pattern become said remaining resist pattern in said resist etching step, and after said resist etching step, a second patterning step of etching and removing said metal film for source/drain electrodes, said semiconductor film doped with impurities and a part of said semiconductor film by using said remaining resist pattern as a mask to form a channel region of said thin film transistor in said laminated film is performed.

12. The process for forming a pattern according to claim 11, wherein a plasma treatment step of modifying remaining resist pattern said second resist film out of said resist pattern to a modified resist film having higher resistance against dry-etching than that of said first resist film is performed between said first patterning step and said resist etching step.

13. The process for forming a pattern according to claim 12, wherein said modified resist film is formed such that said second resist film is made to include silicon atoms to change said second resist film into a silicon-doped second resist film and then, said silicon-doped second resist film is modified to a silicon oxide film through said plasma treatment step performed using a mixed gas containing at least oxygen.

14. The process for forming a pattern according to claim 11, wherein said process for forming a pattern further comprises after said second patterning step:
 a step of removing said remaining resist pattern used to form said channel region of said thin film transistor and subsequently, depositing a protective insulating film covering said gate insulating film;
 a step of coating a third resist film and a fourth resist film in order on said protective insulating film and patterning said third resist film and said fourth resist film to make said third resist film broader than said fourth resist film while making said fourth resist film positioned on said third resist film to form a second resist pattern consisting of said third resist film and said fourth resist film, said second resist pattern having an opening therein;
 a step of at least removing associated portion of said protective insulating film by using said second resist pattern as a mask to expose a surface of an electrically conductive layer consisting of said laminated film and positioned under said protective insulating film; and
 a step of selectively etching said third resist film out of said second resist pattern to make an overhang of said fourth resist film with respect to said third resist film in said opening,
 wherein said overhang is formed such that said fourth resist film is made to include silicon atoms to change said fourth resist film into a silicon-doped fourth resist film and then, said silicon-doped fourth resist film is modified to a silicon oxide film through a plasma treatment performed using a mixed gas containing at least oxygen, and thereafter, an associated part of said third resist film is removed in a lateral direction.

15. The process for forming a pattern according to claim 14, wherein an electrically conductive material is deposited on a surface consisting of said second resist pattern, said protective insulating film and said electrically conductive layer, and said second resist pattern is removed together with said electrically conductive material thereon to leave said electrically conductive material in and around said opening after forming said overhang.

16. The process for forming a pattern according to claim 10, wherein a common electrode is formed together with said gate wiring to have comb-shaped electrodes and in said resist pattern formation step, said resist pattern consisting of said first resist film and said second resist film is formed on said metal film for source/drain electrodes to cover a later-formed pixel electrode, said later-formed pixel electrode being interposed between said comb-shaped electrodes of said common electrode.

17. The process for forming a pattern according to claim 10, wherein said second resist film is coated as a resist film having higher resistance against an etchant used in said resist etching step than that of said first resist film in said resist pattern formation step.

18. The process for forming a pattern according to claim 1, wherein said initial resist pattern is formed such that said first resist film and said second resist film are exposed by using a reticle having a light-shielding portion and a translucent portion as a mask and then developed.

19. The process for forming a pattern according to claim 1, wherein said initial resist pattern includes a pair of isolated regions made of said second resist films such that said first resist film is exposed and extended between said pair of isolated regions.

20. The process for forming a pattern according to claim 1, wherein said initial resist pattern includes an overhang portion of said second resist film with respect to said first resist film in said resist etching step.

* * * * *

UNITED STATES PATENT AND TRADEMARK OFFICE
CERTIFICATE OF CORRECTION

PATENT NO.   : 6,767,694 B2
DATED        : July 27, 2004
INVENTOR(S)  : Kido

It is certified that error appears in the above-identified patent and that said Letters Patent is hereby corrected as shown below:

Title page,
Item [54], Title, "CRYSTAL APPARATUS" should be -- CRYSTAL DISPLAY APPARATUS --.

Signed and Sealed this

Seventh Day of December, 2004

JON W. DUDAS
*Director of the United States Patent and Trademark Office*